(12) United States Patent
Miyauchi et al.

(10) Patent No.: US 7,307,032 B2
(45) Date of Patent: Dec. 11, 2007

(54) LOW-TEMPERATURE CO-FIRED CERAMICS MATERIAL AND MULTILAYER WIRING BOARD USING THE SAME

(75) Inventors: Yasuharu Miyauchi, Tokyo (JP); Tomohiro Arashi, Tokyo (JP)

(73) Assignee: TDK Corporation, Tokyo (JP)

( * ) Notice: Subject to any disclaimer, the term of this patent is extended or adjusted under 35 U.S.C. 154(b) by 221 days.

(21) Appl. No.: 11/166,367

(22) Filed: Jun. 27, 2005

(65) Prior Publication Data

US 2005/0288167 A1    Dec. 29, 2005

(30) Foreign Application Priority Data

Jun. 28, 2004 (JP) ............................ 2004-190174
Jun. 28, 2004 (JP) ............................ 2004-190183
Mar. 24, 2005 (JP) ............................ 2005-085226

(51) Int. Cl.
*C03C 14/00*    (2006.01)
*B32B 17/06*    (2006.01)

(52) U.S. Cl. .................... 501/32; 428/426; 428/428

(58) Field of Classification Search ................ 428/426, 428/428; 501/32
See application file for complete search history.

(56) References Cited

U.S. PATENT DOCUMENTS 4,777,092 A * 10/1988 Kawakami et al. ......... 428/428
4,939,106 A    7/1990 Miyakoshi et al.

FOREIGN PATENT DOCUMENTS

| EP | 0 552 377 A1 | | 7/1993 |
| JP | 05-211006 | | 8/1993 |
| JP | 7-58454 | * | 3/1995 |
| JP | 2000-264677 | * | 9/2000 |
| JP | 2004-083373 | | 3/2004 |

OTHER PUBLICATIONS

Patent Abstracts of Japan, JP 01-132194, May 24, 1989.

* cited by examiner

*Primary Examiner*—Karl Group
(74) *Attorney, Agent, or Firm*—Oblon, Spivak, McClelland, Maier & Neustadt, P.C.

(57) ABSTRACT

Objects of the present invention are to provide a low-temperature co-fired ceramic material having a coefficient of linear thermal expansion controlled and has a high dielectric constant, and to reduce the warpage of a fired product even if it has an unsymmetrical lamination structure in a multilayer wiring board in which glass-ceramic mixed layers of different compositions are laminated.

A low-temperature co-fired ceramic material in accordance with the present invention includes: $SiO_2$—$B_2O_3$—$Al_2O_3$—alkaline earth metal oxide based glass, alumina, titania, and cordierite; glass, titania, and cordierite; or glass, titania, and mullite. When a multilayer wiring board is made of the low-temperature co-fired ceramic material, the content of cordierite or mullite of the substrate material is adjusted to control a difference in a coefficient of linear thermal expansion between the layers of the substrate material to not more than $0.25 \times 10^{-6}/°C$.

19 Claims, 10 Drawing Sheets

LOW-TEMPERATURE CO-FIRED CERAMICS MATERIAL AND MULTILAYER WIRING BOARD USING THE SAME

BACKGROUND OF THE INVENTION

1. Field of the Invention

The present invention relates to a glass-ceramic substrate including a glass component and a ceramic component, that is, a low-temperature co-fired ceramic material and a multilayer wiring board using the same.

2. Description of the Related Art

In an insulating wiring board for a semiconductor chip, a technology relating to a glass-ceramic substrate (low-temperature co-fired ceramics (LTCC substrate)) that can be fired at low temperature not higher than 1000° C. so as to be fired together with conductor material and resistance material at the same time is disclosed (refer to, for example, Japanese Patent Laid-Open Application No. 1-132194 and Japanese Patent Laid-Open Application No. 5-211006). This substrate is produced in the following manner to construct a multilayer wiring board: first, a green sheet is formed; conductive lines are printed on the surface of the green sheet with conductor material and resistance material; a plurality of printed green sheets are laminated and pressed to form a laminated material; and then the laminated material is fired. This substrate is used as an LTCC module such as high-frequency superimposing module, antenna switch module, and filter module.

For the purpose of manufacturing a multilayer wiring board, for example, a porcelain composition of high thermal expansion that includes glass including SrO and filler including metal oxide having a coefficient of linear thermal expansion of $6\times10^{-6}/°$ C. or more within a temperature range of 40 to 400° C. and cordierite is disclosed as a porcelain composition to be used for a glass-ceramic substrate (see, for example patent Japanese Patent Laid-Open Application No. 2004-83373). Here, Japanese Patent Laid-Open Application No. 2004-83373 describes that, for example, quartz, forsterite, or enstatite is preferably used as the metal oxide. In this manner, the main object of Japanese Patent Laid-Open Application No. 2004-83373 is to provide such a low-temperature fired porcelain of high thermal expansion and low dielectric constant that is a porcelain of high thermal expansion having a coefficient of linear thermal expansion of $8\times10^{-6}/°$ C. to $15\times10^{-6}/°$ C. and having a low dielectric constant, that is, a dielectric constant of less than 7 at 1 MHz.

SUMMARY OF THE INVENTION (Problem to be Soloved)

In recent years, to increase production efficiency, in many cases, firing is performed in the form of a collective substrate so as to produce a plurality of products from one substrate. At this time, to keep the accuracy of the products from this collective substrate, the flatness of the collective substrate is increasingly required.

At the same time, to increase the packing density of an LTCC module and to reduce its size, it is desired to form a multilayer wiring board not only by laminating glass-ceramic mixed layers having same dielectric constants but also by laminating glass-ceramic mixed layers having different dielectric constants.

However, when a multilayer wiring board is formed by laminating glass-ceramic mixed layers having different compositions to develop different dielectric constants, there is presented a problem that a fired product is warped because the glass-ceramic mixed layers having different compositions have different coefficients of linear thermal expansion.

To solve the problem that a fired product is warped, green sheets are laminated in a symmetrical structure in the direction of lamination to cancel a difference in a coefficient of linear thermal expansion between the green sheets to thereby prevent a fired product from being warped. However, to improve the degree of flexibility in the designing of a substrate and to flexibly respond to user's demand, it is desired that the warpage of a fired product is small even if the fired product is not formed in a symmetrical structure.

Therefore, the first object of the present invention is to provide a low-temperature co-fired ceramic material that has a coefficient of linear thermal expansion controlled in a predetermined range and has a high dielectric constant, that is, to reduce the thickness and size of a module by inserting a capacitor layer of high capacity into a multilayer wiring board. Further, the second object of the present invention is to reduce the warpage of a fired product, even if it does not have a symmetrical structure in a multilayer wiring board in which glass-ceramic mixed layers of different compositions are laminated, to improve the degree of flexibility in the designing of a substrate.

The present inventors found that the coefficient of linear thermal expansion of a low-temperature co-fired ceramic material could be easily controlled by adding cordierite or mullite as filler to the material and by increasing or decreasing the content of cordierite or mullite and have completed the present invention.

That is, a low-temperature co-fired ceramic material in accordance with the present invention is characterized by including: 60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; more than 0 to not more than 16 volume % alumina; 10 to 26 volume % titania; and 2 to 15 volume % cordierite. Hereinafter referred to as the low-temperature co-fired ceramic material(I). By adding titania and alumina and at the same time by adding cordierite as filler, it is possible to keep a high dielectric constant and to easily control a coefficient of linear thermal expansion according to the content of cordierite.

Further, a low-temperature co-fired ceramic material in accordance with the present invention is characterized by including: 60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; 14 to 27 volume % titania; and 5 to 15.5 volume % cordierite. Hereinafter referred to as the low-temperature co-fired ceramic material(II). By adding titania and at the same time by adding cordierite as filler, it is possible to keep a high dielectric constant and to easily control a coefficient of linear thermal expansion according to the content of cordierite.

Still further, a low-temperature co-fired ceramic material in accordance with the present invention is characterized by including: not less than 60 to less than 66 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; more than 10 to less than 13 volume % titania; and more than 22 to less than 30 volume % mullite. Hereinafter referred to as the low-temperature co-fired ceramic material(III). By adding titania and at the same time by adding mullite as filler, it is possible to keep a high dielectric constant and to easily control a coefficient of linear thermal expansion according to the content of mullite.

It is preferable that the low-temperature co-fired ceramic material in accordance with the present invention, that inclueds (I), (II) and (III), has a coefficient of linear thermal expansion of $5.90 \times 10^{-6}$ to $6.40 \times 10^{-6}/°$ C. in a range of 50 to 300° C. By making the low-temperature co-fired ceramic material have a coefficient of linear thermal expansion in the above range, the low-temperature co-fired ceramic material in accordance with the present invention can have a coefficient of linear thermal expansion of the same level as a conventional low-temperature co-fired ceramic material.

It is preferable that the low-temperature co-fired ceramic material in accordance with the present invention, that inclueds (I), (II) and (III), has a dielectric constant not smaller than 10 at a frequency of 1.9 GHz at room temperature. By making the low-temperature co-fired ceramic material have a dielectric constant not less than 10, it is possible to make a capacitor of high capacity in combination with a conventional low-temperature co-fired ceramic material having a low dielectric constant.

A multilayer wiring board in accordance with the present invention is characterized in that in a multilayer wiring board of the type in which glass-ceramic mixed layers are laminated, at least one layer of the glass-ceramic mixed layers is made of a low-temperature co-fired ceramic material including: 60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; more than 0 to not more than 16 volume % alumina; 10 to 26 volume % titania; and 2 to 15 volume % cordierite.

A multilayer wiring board in accordance with the present invention is characterized in that in a multilayer wiring board of the type in which glass-ceramic mixed layers are laminated, at least one layer of the glass-ceramic mixed layers is made of a low-temperature co-fired ceramic material including: 60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; 14 to 27 volume % titania; and 5 to 15.5 volume % cordierite.

A multilayer wiring board in accordance with the present invention is characterized in that in a multilayer wiring board of the type in which glass-ceramic mixed layers are laminated, at least one layer of the glass-ceramic mixed layers is made of a low-temperature co-fired ceramic material including: not less than 60 to less than 66 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; more than 10 to less than 13 volume % titania; and more than 22 to less than 30 volume % mullite.

It is preferable that in the multilayer wiring board in accordance with the present invention, the low-temperature co-fired ceramic material, that inclueds (I), (II) and (III), has a coefficient of linear thermal expansion of $5.90 \times 10^{-6}$ to $6.40 \times 10^{-6}/°$ C. in a range of 50 to 300° C. and a dielectric constant not smaller than 10 at a frequency of 1.9 GHz at room temperature. In the low-temperature co-fired ceramic material in accordance with the present invention, a coefficient of linear thermal expansion can be controlled in a range of $5.90 \times 10^{-6}$ to $6.40 \times 10^{-6}/°$ C. with a dielectric constant kept at a high value. Hence, for example, when a multilayer wiring board is made by combining the low-temperature co-fired ceramic material with a low-temperature co-fired ceramic material having a low dielectric constant, it is possible to control a coefficient of linear thermal expansion within a predetermined range and to reduce the warpage of the substrate.

It is preferable that in the multilayer wiring board in accordance with the present invention, the difference in a coefficient of linear thermal expansion in a range of 50 to 300° C. between a glass-ceramic mixed layer made of the low-temperature co-fired ceramic material(I), (II) or (III) and other glass-ceramic mixed layer other than the glass-ceramic mixed layer is not larger than $0.25 \times 10^{-6}/°$ C. By controlling a difference in a coefficient of linear thermal expansion in the range, it is possible to reduce the warpage of the substrate.

It is preferable that in the multilayer wiring board in accordance with the present invention, other glass-ceramic mixed layer other than the glass-ceramic mixed layer made of the low-temperature co-fired ceramic material(I), (II) or (III) has a dielectric constant of 5 to 8 at a frequency of 1.9 GHz at room temperature. By laminating glass-ceramic mixed layers having different dielectric constants to form a multilayer wiring board, it is possible to increase the packaging density of an LTCC module and to reduce its size.

It is preferable that in the multilayer wiring board in accordance with the present invention, other glass-ceramic mixed layer other than a glass-ceramic mixed layer made of the low-temperature co-fired ceramic material(I), (II) or (III) is a glass-ceramic mixed layer made of a low-temperature co-fired ceramic material including: 58 to 76 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; and 24 to 42 volume % alumina.

In the multilayer wiring board in accordance with the present invention, by reducing the difference in a coefficient of linear thermal expansion between the glass-ceramic mixed layers, the occurrence of warpage is controlled and the warpage includes a case where a warpage is not larger than 200 μm for a size of 50 mm square. Further, the warpage includes also a case where a warpage is not larger than 200 μm for a size of 100 mm square. By making the warpage not larger than the above value, it is possible to mount electronic parts on the surface of the multilayer wiring board with high accuracy.

(Effect of the Invention)

According to the present invention, by adding cordierite or mullite as filler for controlling a coefficient of linear thermal expansion to a low-temperature co-fired ceramic material, it is possible to prevent the low-temperature co-fired ceramic material from becoming high-expansion porcelain and to make the low-temperature co-fired ceramic material have a high dielectric constant. Moreover, the present invention can reduce the warpage of a fired product even if a lamination structure is not a symmetrical structure in a multilayer wiring board having glass-ceramic mixed layers of different compositions laminated. With this, a capacitor layer of high capacity can be inserted into the multilayer wiring board. As a result, it is possible to reduce the thickness and size of a module and at the same time to enhance the degree of flexibility in the designing of a substrate.

DETAILED DESCRIPTION OF THE PREFERRED EMBODIMENTS

Figure 1A:
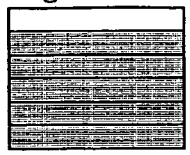
FIG. 1 is a schematic sectional view of a multilayer wiring board. Lamination structures shown in FIGS. 1A to 1J are specific examples when glass-ceramic mixed layers of different compositions are laminated in an unsymmetrical structure. Lamination structures shown in FIGS. 1K to 1O are specific examples when glass-ceramic mixed layers of different compositions are laminated in a symmetrical structure.
Figure 1B:
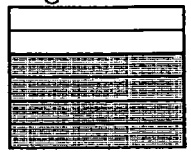

Hereafter, the present invention will be described in detail by showing the preferred embodiments of the present invention but it is not intended to limit the present invention to these descriptions.

First Embodiment

A low-temperature co-fired ceramic material in accordance with the first embodiment includes 60 to 78 volume % glass component and 40 to 22 volume % ceramic component, that is, ceramic component including alumina ($Al_2O_3$), titania ($TiO_2$), and cordierite ($Mg_2Al_4Si_5O_{18}$). That is, this low-temperature co-fired ceramic material is the low-temperature co-fired ceramic material(I).

Here, glass needs to have a composition of 46 to 60 mass %, preferably 47 to 55 mass % $SiO_2$; 0.5 to 5 mass %, preferably 1 to 4 mass % $B_2O_3$; 6 to 17.5 mass %, preferably 7 to 16.5 mass % $Al_2O_3$; and 25 to 45 mass %, preferably 30 to 40 mass % alkaline earth metal oxide. When this $SiO_2$ is less than 46 mass %, vitrification becomes difficult, whereas when $SiO_2$ is more than 60 mass %, a glass softening point becomes so high that glass cannot be sintered at low temperature. Further, when $B_2O_3$ is more than 5 mass %, resistance to moisture after sintering becomes low, whereas when $B_2O_3$ is less than 0.5 mass %, a vitrification temperature becomes a little higher and a sintering temperature becomes too high, which is not desirable. Still further, when $Al_2O_3$ is less than 6 mass %, strength of glass component becomes lower, whereas when $Al_2O_3$ is more than 17.5 mass %, vitrification becomes difficult. The alkaline earth metal oxide of this glass component includes MgO, CaO, BaO, and SrO and at least 60 mass %, preferably not less than 80 mass % of a total amount of the alkaline earth metal oxide needs to be SrO. When the amount of SrO is less than 60 mass %, a glass softening temperature becomes high and hence low-temperature firing is difficult. By adding a small amount of other CaO, MgO, and BaO in combination, the viscosity of melted glass can be decreased and a sintering temperature range can be greatly expanded to facilitate manufacturing, so that it is preferable to use these alkaline earth metal oxides in combination. In terms of effect of addition, it is preferable to add 1 mass % or more in total CaO, MgO, and BaO of the alkaline earth metal oxides, and it is more preferable to add not less than 0.2 mass % CaO and MgO, respectively, and it is particularly preferable to add not less than 0.5 mass % CaO and MgO, respectively. It is preferable to make the amount of CaO in the alkaline earth metal oxide less than 10 mass %, and to make the amount of MgO in the alkaline earth metal oxide not more than 6 mass %. When the amounts of these oxides are larger than the amounts described above, porcelain of high strength cannot be obtained and the degree of crystallization of glass is hard to control.

The low-temperature co-fired ceramic material(I) in accordance with the first embodiment needs to include 60 to 78 volume %, preferably 60 to 73 volume % glass component. When the glass component is less than 60 volume %, that is, ceramic component is more than 40 volume %, a dense sintered body cannot be obtained at 1000° C. or lower. On the other hand, when the glass component is more than 78 volume %, that is, ceramic component is less than 22 volume %, a transverse rupture strength is decreased.

The content of alumina, which is one of the ceramic components, is more than volume % to not more than 16 volume %, preferably 1 to 8 volume %. While alumina is added to adjust a dielectric constant, when more than 16 volume % alumina is added, a target dielectric constant cannot be obtained.

The content of titania, which is one of the ceramic components, is 10 to 26 volume %, preferably 14 to 25 volume %. While titania is added to increase a dielectric constant, when less than 10 volume % titania is added, a dielectric constant becomes low. On the other hand, when more than 26 volume % titania is added, a coefficient of linear thermal expansion of the low-temperature co-fired ceramic material(I) becomes too large.

The content of cordierite, which is one of the ceramic components, is 2 to 15 volume %, preferably 6 to 14 volume %. Cordierite has a coefficient of linear thermal expansion as low as $1.8 \times 10^{-6}/°$ C. in a range of 50 to 300° C. and has a dielectric constant as low as 4.8. Hence, by changing the content of cordierite in the low-temperature co-fired ceramic material(I), it is possible to lower a coefficient of linear thermal expansion without making a large effect on the dielectric constant. When the content of cordierite is less than 2 volume %, the coefficient of linear thermal expansion of the low-temperature co-fired ceramic material(I) becomes large. On the other hand, when the content of cordierite is more than 15 volume %, the coefficient of linear thermal expansion of the low-temperature co-fired ceramic material (I) becomes too small.

It is recommended that the low-temperature co-fired ceramic material(I) in accordance with the first embodiment be made to have a coefficient of linear thermal expansion of $5.90 \times 10^{-6}$ to $6.40 \times 10^{-6}/°$ C. in a range of 50 to 300° C. and has a dielectric constant not less than 10 at a frequency of 1.9 GHz at room temperature by adjusting the respective components. In particular, the controlling of a coefficient of linear thermal expansion is performed by adjusting the content of cordierite. It is possible to provide a low-temperature co-fired ceramic material having a coefficient of linear thermal expansion prevented from becoming high and having a high dielectric constant.

The low-temperature co-fired ceramic material(I) in accordance with the first embodiment may include other components if the addition of the other components is not opposite to the object of the present invention.

Next, a case where the low-temperature co-fired ceramic material(I) in accordance with the first embodiment is used for a multilayer wiring board will be described. A multilayer wiring board in accordance with the first embodiment is a multilayer wiring board in which glass-ceramic mixed layers are laminated and in which at least one layer of the glass-ceramic mixed layers is formed of a low-temperature co-fired ceramic material that includes: 60 to 78 volume % glass, which has a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; more than 0 to not more than 16 volume % alumina; 10 to 26 volume % titania; and 2 to 15 volume % cordierite. Further, it is desirable that the low-temperature co-fired ceramic material(I) has a coefficient of linear thermal expansion of $5.90 \times 10^{-6}$ to $6.40 \times 10^{-6}/°$ C. in a range of 50 to 300° C. and has a dielectric constant not less than 10 at a frequency of 1.9 GHz at room temperature.

It is also recommended that only the glass-ceramic mixed layers made of the low-temperature co-fired ceramic material(I) in accordance with the first embodiment are laminated to form the multilayer wiring board. However, as shown in FIG. 1, in the first embodiment, it is also possible to form the multilayer wiring board by forming at least one layer of the glass-ceramic mixed layers of the low-temperature co-fired ceramic material(I) in accordance with the first embodiment and by laminating glass-ceramic mixed layers made of different compositions thereon. In FIG. 1 are shown schematic sectional views of a multilayer wiring board. Lamination structures shown in FIGS. 1A to 1E and FIGS. 1F to 1J are specific examples in cases where glass-ceramic mixed layers made of the low-temperature co-fired ceramic material(I) and glass-ceramic mixed layers made of different compositions are laminated in unsymmetrical structures. Lamination structures shown in FIGS. 1K to 1O are specific examples in cases where glass-ceramic mixed layers made of the low-temperature co-fired ceramic material(I) and glass-ceramic mixed layers made of different compositions are laminated in symmetrical structures. In FIG. 1 is shown a case where glass-ceramic mixed layers of two different compositions are laminated to produce a multilayer wiring board. For example, the glass-ceramic mixed layers shown by shaded areas are formed of the low-temperature co-fired ceramic material(I) in accordance with the first embodiment and the glass-ceramic mixed layers shown by white areas (not shaded) are formed of other low-temperature co-fired ceramic material. Here, the multilayer wiring board may be formed of glass-ceramic mixed layers of three or more different kinds of compositions.

It is preferable that the low-temperature co-fired ceramic material(I) in accordance with the first embodiment has physical properties of a coefficient of linear thermal expansion of $5.90 \times 10^{-6}$ to $6.40 \times 10^{-6}/°$ C. in a range of 50 to 300° C. and a dielectric constant not less than 10 at a frequency of 1.9 GHz at room temperature. However, when the glass-ceramic mixed layer made of the low-temperature co-fired ceramic material(I) in accordance with the first embodiment is combined with the glass-ceramic mixed layer made of other composition to form a multilayer wiring board, by making the difference in a coefficient of linear thermal expansion in a range of 50 to 300° C. between the glass-ceramic mixed layers not more than $0.25 \times 10^{-6}/°$ C., the warpage of the multilayer wiring board can be controlled. The warpage is shown by W in FIG. 2. By making the difference in a coefficient of linear thermal expansion between the glass-ceramic mixed layers not more than $0.25 \times 10^{-6}/°$ C., the warpage W of the multilayer wiring board can be made not more than 200 μm for a size of 50 mm square or not more than 200 μm for a size of 100 mm square. At this time, assuming that the length of one side of a substrate (when there are a long side and a short side, the long side) is t, a warpage ratio calculated by W/t can be made not more than 0.4%, preferably not more than 0.2%. By making the warpage ratio not larger than the above value, electronic parts can be mounted on the surface of the multilayer wiring board with high accuracy.

When the difference in a coefficient of linear thermal expansion between the glass-ceramic mixed layers is larger than $0.25 \times 10^{-6}/°$ C., to decrease the warpage, the glass-ceramic mixed layers need to be arranged in such a way as to be symmetrical with respect to the center in the direction of lamination, as shown in FIGS. 1K to 1O. However, in the multilayer wiring board in accordance with the first embodiment, a difference in a coefficient of linear thermal expansion can be made not larger than $0.25 \times 10^{-6}/°$ C. by controlling the content of cordierite, so that even if the glass-ceramic mixed layers are laminated in unsymmetrical structures as shown in FIGS. 1A to 1J, the warpage can be kept small.

Further, if the dielectric constant of the other glass-ceramic mixed layer, which is made of material other than the low-temperature co-fired ceramic material(I) in accordance with the first embodiment, at a frequency of 1.9 GHz at room temperature is made 5 to 8, a difference in a dielectric constant can be at least 2 or more, so that the degree of flexibility in designing a substrate can be further increased.

For example, a glass-ceramic mixed layer made of the low-temperature co-fired ceramic material described in Japanese Patent Laid-Open Application No. 1-132194 can be selected as the other glass-ceramic mixed layer made of material other than the low-temperature co-fired ceramic material(I) in accordance with the first embodiment. The low-temperature co-fired ceramic material described in Japanese Patent Laid-Open Application No. 1-132194 has a coefficient of linear thermal expansion of $5.90 \times 10^{-6}$ to $6.40 \times 10^{-6}/°$ C. in a range of 50 to 300° C. and a dielectric constant of 5 to 8 at a frequency of 1.9 GHz at room temperature. Hence, the low-temperature co-fired ceramic material described in Japanese Patent Laid-Open Application No. 1-132194 is suitable for forming a multilayer wiring board in combination with the low-temperature co-fired ceramic material(I) in accordance with the first embodiment. The low-temperature co-fired ceramic material described in Japanese Patent Laid-Open Application No. 1-132194 includes: 58 to 76 volume % glass, which has a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; and 24 to 42 volume % alumina as filler. It is because if the glass component is less than 58%, that is, ceramic component is more than 42 volume %, a dense sintered body cannot be obtained at 1000° C. or lower. On the other hand, if the glass component is more than 76 volume %, that is, ceramic component is less than 24 volume %, a transverse rupture strength is decreased.

When the other glass-ceramic mixed layers are glass-ceramic mixed layers made of the low-temperature co-fired ceramic material described in Japanese Patent Laid-Open Application No. 1-132194, to make the difference in a coefficient of linear thermal expansion in a range of 50 to 300° C. between the layers not more than $0.25 \times 10^{-6}/°$ C. and to make the difference in a dielectric constant between the layers not less than 2, the content of alumina, which is one of ceramic components, is made 1 to 8 volume %, preferably 4 to 8 volume % in the glass-ceramic mixed layers made of the low-temperature co-fired ceramic material(I) in accordance with the first embodiment. Further, the content of titania, which is one of ceramic components, is preferably made 14 to 25 volume %, more preferably 14 to 16 volume %. Still further, the content of cordierite, which is one of ceramic components, is preferably made 6 to 14 volume %, more preferably 6 to 7 volume %. Still further, the content of glass component is preferably made 60 to 73 volume %, more preferably 72 to 73 volume %. Here, it is preferable that the composition of glass is 47 to 55 mass % $SiO_2$, 1 to 3 mass % $B_2O_3$, 7 to 16.5 mass % $Al_2O_3$, and 30 to 40 mass % alkaline earth metal oxide.

At least one or more layer of the other glass-ceramic mixed layers other than the glass-ceramic mixed layer made of the low-temperature co-fired ceramic material(I) in accordance with the first embodiment is formed of, for example, the low-temperature co-fired ceramic material relating to a wiring board described in Japanese Patent Laid-Open Application No. 1-132194. Preferably, all the other glass-ceramic mixed layers are formed of the low-temperature co-fired ceramic material relating to a wiring board described in Japanese Patent Laid-Open Application No. 1-132194.

To manufacture the multilayer wiring board in accordance with the first embodiment, for example, raw materials of the above-described ceramic components and glass component are made into powders not more than 10 μm, preferably 1 to 4 μm in mean particle diameter, and then the raw material powders are mixed with each other and then water or solvent and appropriate binder, as required, are added to the mixed raw material powders to prepare paste. Next, this paste is formed into a sheet having approximately 0.1 to 1.0 mm by the using a doctor blade or an extruder to produce a ceramic green sheet. A plurality of ceramic green sheets are laminated and are pressed in a heating state at 40 to 120° C. to form a laminated material. This laminated material is sintered at 800 to 1000° C. at the same time to produce a multiple-layer substrate. Further, it is also recommended that: power-like mixed material of respective components is dry-pressed to form a sheet; then a plurality of sheets are laminated and then pressed to form a laminated material; and the laminated material is sintered. At this time, it is also recommended that conductors, resistors, overcoat, thermistors are provided and then are sintered at the same time to form a multilayer wiring board.

Second Embodiment

A low-temperature co-fired ceramic material in accordance with the second embodiment includes 60 to 78 volume % glass component and 22 to 40 volume % ceramic component, that is, ceramic component including titania ($TiO_2$) and cordierite ($Mg_2Al_4Si_5O_{18}$). That is, this low-temperature co-fired ceramic material is the low-temperature co-fired ceramic material(II).

Here, the same glass as is in the case of the first embodiment is used as glass.

The low-temperature co-fired ceramic material(II) in accordance with the second embodiment preferably includes 60 to 78 volume % glass component. When the glass component is less than 60 volume %, that is, ceramic component is more than 40 volume %, a dense sintered body cannot be obtained under 1000° C. On the other hand, when the glass component is more than 78 volume %, that is, ceramic component is less than 22 volume %, transverse rupture strength is decreased.

It is preferable that the content of titania, which is one of the ceramic components, is 14 to 27 volume %. While titania is added to increase a dielectric constant, when less than 14 volume % titania is added, a dielectric constant becomes low. On the other hand, when more than 27 volume % titania is added, a coefficient of linear thermal expansion of the low-temperature co-fired ceramic material(II) becomes too large.

It is preferable that the content of cordierite, which is one of the ceramic components, is 5 to 15.5 volume %. Cordierite has a coefficient of linear thermal expansion as low as $1.8 \times 10^{-6}/°$ C. in a range of 50 to 300° C. and has a dielectric constant as low as 4.8. Hence, by changing the content of cordierite in the low-temperature co-fired ceramic material (II), it is possible to lower a coefficient of linear thermal expansion without making a large effect on a dielectric constant. When the content of cordierite is less than 5 volume %, the coefficient of linear thermal expansion of the low-temperature co-fired ceramic material(II) becomes large. On the other hand, when the content of cordierite is more than 15.5 volume %, the coefficient of linear thermal expansion of the low-temperature co-fired ceramic material (II) becomes too small.

It is recommended that the low-temperature co-fired ceramic material(II) in accordance with the second embodiment be made to have a coefficient of linear thermal expansion of $5.90 \times 10^{-6}$ to $6.40 \times 10^{-6}/°$ C. in a range of 50 to 300° C. and has a dielectric constant not less than 10 at a frequency of 1.9 GHz at room temperature by adjusting the respective components. In particular, the controlling of a coefficient of linear thermal expansion is performed by adjusting the content of cordierite. It is possible to provide a low-temperature co-fired ceramic material having a coefficient of linear thermal expansion prevented from becoming too high and having a high dielectric constant.

The low-temperature co-fired ceramic material(II) in accordance with the second embodiment may include other components if the addition of the other components is not opposite to the object of the present invention.

Next, a case where the low-temperature co-fired ceramic material(II) in accordance with the second embodiment is used for a multilayer wiring board will be described. A multilayer wiring board in accordance with the second embodiment is a multilayer wiring board in which glass-ceramic mixed layers are laminated and in which at least one layer of the glass-ceramic mixed layers is formed of a low-temperature co-fired ceramic material that includes: 60 to 78 volume % glass component, which has a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; 14 to 27 volume % titania; and 5 to 15.5 volume % cordierite. Further, it is preferable that the low-temperature co-fired ceramic material has a coefficient of linear thermal expansion of $5.90 \times 10^{-6}$ to $6.40 \times 10^{-6}/°$ C. in a range of 50 to 300° C. and has a dielectric constant not less than 10 at a frequency of 1.9 GHz at room temperature.

It is also recommended that only the glass-ceramic mixed layers made of the low-temperature co-fired ceramic material(II) in accordance with the second embodiment are laminated to form the multilayer wiring board. However, as is the case with the first embodiment, as shown in FIG. 1, in the second embodiment, it is also possible to form the multilayer wiring board by forming at least one layer of the glass-ceramic mixed layers of the low-temperature co-fired ceramic material(II) in accordance with the second embodiment and by laminating glass-ceramic mixed layers made of different compositions thereon. In FIG. 1 is shown a multilayer wiring board formed by laminating glass-ceramic mixed layers made of two different compositions. For example, it is recommended that the glass-ceramic mixed layers shown by shaded areas are formed of the low-temperature co-fired ceramic material(II) in accordance with the second embodiment and that the glass-ceramic mixed layers shown by white areas (not shaded) are formed of other low-temperature co-fired ceramic material. Here, the multilayer wiring board may be formed of glass-ceramic mixed layers of three or more different kinds of compositions.

It is preferable that the low-temperature co-fired ceramic material(II) in accordance with the second embodiment has physical properties of a coefficient of linear thermal expansion of $5.90 \times 10^{-6}$ to $6.40 \times 10^{-6}/°$ C. in a range of 50 to 300° C. and a dielectric constant not less than 10 at a frequency of 1.9 GHz at room temperature. However, when the glass-ceramic mixed layer made of the low-temperature co-fired ceramic material in accordance with the second embodiment is combined with the glass-ceramic mixed layer made of other composition to form a multilayer wiring board, by making the difference in a coefficient of linear thermal expansion in a range of 50 to 300° C. between the glass-ceramic mixed layers not more than $0.25 \times 10^{-6}/°$ C., the warpage of the multilayer wiring board can be controlled. As is the case with the first embodiment, the warpage is shown by W in FIG. 2. By making the difference in a coefficient of linear thermal expansion between the glass-ceramic mixed layers not more than $0.25 \times 10^{-6}/°$ C., the warpage W of the multilayer wiring board can be made not more than 200 μm for a size of 50 mm square or not more than 200 μm for a size of 100 mm square. At this time, assuming that the length of one side of a substrate (when there are a long side and a short, the long side) is t, a warpage ratio calculated by W/t can be made not more than 0.4%, preferably not more than 0.2%. By making the warpage ratio not larger than the above value, electronic parts can be mounted on the surface of the multilayer wiring board with high accuracy.

When the difference in a coefficient of linear thermal expansion between the glass-ceramic mixed layers is larger than $0.25 \times 10^{-6}/°$ C., to decrease the warpage, like lamination structures shown in FIGS. 1K to 1O, the glass-ceramic mixed layers need to be arranged in such a way as to be symmetrical with respect to the center in the direction of lamination. However, in the multilayer wiring board in accordance with the second embodiment, a difference in a coefficient of linear thermal expansion can be made within $0.25 \times 10^{-6}/°$ C. by controlling the content of cordierite, so that even if the glass-ceramic mixed layers are laminated in unsymmetrical structures as shown in FIGS. 1A to 1J, the warpage can be kept small.

Further, if the dielectric constant of the other glass-ceramic mixed layer, which is made of material other than the low-temperature co-fired ceramic material(II) in accordance with the second embodiment, at a frequency of 1.9 GHz at room temperature is 5 to 8, a difference in a dielectric constant can be at least 2 or more, so that the degree of flexibility in designing a substrate can be further increased.

For example, a glass-ceramic mixed layer made of the low-temperature co-fired ceramic material described in Japanese Patent Laid-Open Application No. 1-132194 can be selected as the other glass-ceramic mixed layer made of material other than the low-temperature co-fired ceramic material(II) in accordance with the second embodiment. The low-temperature co-fired ceramic material described in Japanese Patent Laid-Open Application No. 1-132194 has a coefficient of linear thermal expansion of $5.90 \times 10^{-6}$ to $6.40 \times 10^{-6}/°$ C. in a range of 50 to 300° C. and a dielectric constant of 5 to 8 at a frequency of 1.9 GHz at room temperature. Hence, the low-temperature co-fired ceramic material described in Japanese Patent Laid-Open Application No. 1-132194 is suitable for forming a multilayer wiring board in combination with the low-temperature co-fired ceramic material(II) in accordance with the second embodiment. The low-temperature co-fired ceramic material described in Japanese Patent Laid-Open Application No. 1-132194 includes: 58 to 76 volume % glass component, which has a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; and 24 to 42 volume % alumina as filler. It is because if the glass component is less than 58%, that is, ceramic component is more than 42 volume %, a dense sintered body cannot be obtained at 1000° C. or lower. On the other hand, if the glass component is more than 76 volume %, that is, ceramic component is less than 24 volume %, a transverse rupture strength is decreased.

When the other glass-ceramic mixed layers are glass-ceramic mixed layers made of the low-temperature co-fired ceramic material described in Japanese Patent Laid-Open Application No. 1-132194, to make the difference in a coefficient of linear thermal expansion in a range of 50 to 300° C. between the layers not more than $0.25 \times 10^{-6}/°$ C., preferably $0.10 \times 10^{-6}/°$ C., and to make the difference in a dielectric constant between the layers not less than 2, the content of titania, which is one of ceramic components, is preferably made 14 to 27 volume %, more preferably 15 to 25 volume % in the glass-ceramic mixed layers made of the low-temperature co-fired ceramic material(II) in accordance with the second embodiment. Further, the content of cordierite, which is one of ceramic components, is preferably made 5 to 15.5 volume %, more preferably 5 to 13 volume %. Still further, the content of glass component is preferably made 60 to 78 volume %, more preferably 62 to 78 volume %. Here, the composition of glass is 47 to 55 mass % $SiO_2$, 1 to 3 mass % $B_2O_3$, 7 to 16.5 mass % $Al_2O_3$, and 30 to 40 mass % alkaline earth metal oxide.

At least one or more layer of the other glass-ceramic mixed layers other than the glass-ceramic mixed layer made of the low-temperature co-fired ceramic material(II) in accordance with the second embodiment is formed of, for example, the low-temperature co-fired ceramic material relating to a wiring board described in Japanese Patent Laid-Open Application No. 1-132194. Preferably, all the other glass-ceramic mixed layers are formed of the low-temperature co-fired ceramic material relating to a wiring board described in Japanese Patent Laid-Open Application No. 1-132194.

The manufacturing method described in the multilayer wiring board in accordance with the first embodiment can be applied to a multilayer wiring board in accordance with the second embodiment under the same conditions.

Third Embodiment

A low-temperature co-fired ceramic material in accordance with the third embodiment includes 60 to less than 66 volume % glass component and 34 to 40 volume % ceramic component, that is, ceramic component including titania ($TiO_2$) and mullite ($Al_6Si_2O_{13}$). That is, this low-temperature co-fired ceramic material is the low-temperature co-fired ceramic material(III).

Here, the same glass as is in the case of the first embodiment is used as glass.

The low-temperature co-fired ceramic material(III) in accordance with the third embodiment preferably includes not less than 60 to less than 66 volume % glass component. When the glass component is less than 60 volume %, that is, ceramic component is more than 40 volume %, a dense sintered body cannot be obtained at 1000° C. or lower. On the other hand, when the glass component is more than 66 volume %, the content of ceramic component is little and hence a dielectric constant and a coefficient of linear thermal expansion of the low-temperature co-fired ceramic material becomes close to the dielectric constant and the coefficient of linear thermal expansion of the glass component. Hence, it is difficult to satisfy a dielectric constant and a coefficient of linear thermal expansion required of the low-temperature co-fired ceramic material at the same time.

It is preferable that the content of titania, which is one of the ceramic components, is more than 10 volume % and less than 13 volume %. While titania is added to increase a dielectric constant, when the content of titania is not more than 10 volume %, a dielectric constant becomes low. On the other hand, when not less than 13 volume % titania is added, the coefficient of linear thermal expansion of the low-temperature co-fired ceramic material(III) becomes too large.

It is preferable that the content of mullite, which is one of the ceramic components, is more than 22 volume % and less than 30 volume %. Mullite has a coefficient of linear thermal expansion as low as $5.0 \times 10^{-6}/°$ C. in a range of 50 to 300° C. and a dielectric constant as low as 7.4. Hence, by changing the content of mullite in the low-temperature co-fired ceramic material(III), it is possible to lower a coefficient of linear thermal expansion. When the content of mullite is not more than 22 volume %, the coefficient of linear thermal expansion of the low-temperature co-fired ceramic material(III) becomes large. On the other hand, when the content of mullite is not less than 30 volume %, the content of glass decreases and hence the material is hard to sinter or the content of titania decreases and a dielectric constant becomes small.

It is recommended that the low-temperature co-fired ceramic material(III) in accordance with the third embodiment has a coefficient of linear thermal expansion of $5.90 \times 10^{-6}$ to $6.40 \times 10^{-6}/°$ C. in a range of 50 to 300° C. and has a dielectric constant not less than 10 at a frequency of 1.9 GHz at room temperature by adjusting the respective components. In particular, the controlling of a coefficient of linear thermal expansion is performed by adjusting the content of mullite. It is possible to provide a low-temperature co-fired ceramic material having a coefficient of linear thermal expansion prevented from becoming high and having a high dielectric constant.

The low-temperature co-fired ceramic material(III) in accordance with the third embodiment may include other components if the addition of the other components is not opposite to the object of the present invention.

Next, a case where the low-temperature co-fired ceramic material(III) in accordance with the third embodiment is used for a multilayer wiring board will be described. A multilayer wiring board in accordance with the third embodiment is a multilayer wiring board in which glass-ceramic mixed layers are laminated and in which at least one layer of the glass-ceramic mixed layers is formed of a low-temperature co-fired ceramic material that includes: not less than 60 to less than 66 volume % glass component, which has a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; more than 10 to less than 13 volume % titania; and more than 22 to less than 30 volume % mullite. Further, it is preferable that the low-temperature co-fired ceramic material(III) has a coefficient of linear thermal expansion of $5.90 \times 10^{-6}$ to $6.40 \times 10^{-6}/°$ C. in a range of 50 to 300° C. and a dielectric constant not less than 10 at a frequency of 1.9 GHz at room temperature.

It is also recommended that only the glass-ceramic mixed layers made of the low-temperature co-fired ceramic material(III) in accordance with the third embodiment are laminated to form the multilayer wiring board. However, as is the case with the first embodiment, as shown in FIG. 1, in the third embodiment, it is also possible to form the multilayer wiring board by forming at least one layer of the glass-ceramic mixed layers of the low-temperature co-fired ceramic material(III) in accordance with the third embodiment and by laminating glass-ceramic mixed layers made of different compositions thereon. In FIG. 1 is shown a multilayer wiring board formed by laminating glass-ceramic mixed layers made of two compositions. For example, it is also recommended that the glass-ceramic mixed layers shown by shaded areas are formed of the low-temperature co-fired ceramic material(III) in accordance with the third embodiment and that the glass-ceramic mixed layers shown by not-shaded areas are formed of other low-temperature co-fired ceramic material. Here, the multilayer wiring board may be formed of glass-ceramic mixed layers of three or more different kinds of compositions.

It is preferable that the low-temperature co-fired ceramic material(III) in accordance with the third embodiment has physical properties of a coefficient of linear thermal expansion of $5.90 \times 10^{-6}$ to $6.40 \times 10^{-6}/°$ C. in a range of 50 to 300° C. and a dielectric constant not less than 10 at a frequency of 1.9 GHz at room temperature. However, when the glass-ceramic mixed layer made of the low-temperature co-fired ceramic material(III) in accordance with the third embodiment is combined with the glass-ceramic mixed layer of other composition to form a multilayer wiring board, by making the difference in a coefficient of linear thermal expansion in a range of 50 to 300° C. between the glass-ceramic mixed layers not more than $0.25 \times 10^{-6}/°$ C., the warpage of the multilayer wiring board can be controlled. As is the case with the first embodiment, the warpage is shown by W in FIG. 2. By making the difference in a coefficient of linear thermal expansion between the glass-ceramic mixed layers not more than $0.25 \times 10^{-6}/°$ C., the warpage W of the multilayer wiring board can be made not more than 200 μm for a size of 50 mm square. At this time, assuming that the length of one side of a substrate (when there are a long side and a short side, the long side) is t, a warpage ratio calculated by W/t can be made not more than 0.4%, preferably not more than 0.2%. By making the warpage ratio not larger than the above value, electronic parts can be mounted on the surface of the multilayer wiring board with high accuracy.

When the difference in a coefficient of linear thermal expansion between the glass-ceramic mixed layers is larger than $0.25 \times 10^{-6}/°$ C., to decrease the warpage, like lamination structures shown in FIGS. 1K to 1O, the glass-ceramic mixed layers need to be arranged in such a way as to be symmetrical with respect to the center in the direction of lamination. However, in the multilayer wiring board in accordance with the third embodiment, a difference in a coefficient of linear thermal expansion can be made within $0.25 \times 10^{-6}/°$ C. by controlling the content of mullite, so that even if the glass-ceramic mixed layers are laminated in unsymmetrical structures as shown in FIGS. 1A to 1E and 1F to 1J, the warpage can be kept small.

Further, if the dielectric constant of the other glass-ceramic mixed layer, which is made of material other than the low-temperature co-fired ceramic material(III) in accordance with the third embodiment, at a frequency of 1.9 GHz at room temperature is 5 to 8, a difference in a dielectric constant can be at least 2 or more, so that the degree of flexibility in designing a substrate can be further increased.

For example, a glass-ceramic mixed layer made of the low-temperature co-fired ceramic material described in Japanese Patent Laid-Open Application No. 1-132194 can be selected as the other glass-ceramic mixed layer made of material other than the low-temperature co-fired ceramic material(III) in accordance with the third embodiment. The low-temperature co-fired ceramic material described in Japanese Patent Laid-Open Application No. 1-132194 has a coefficient of linear thermal expansion of $5.90 \times 10^{-6}$ to $6.40 \times 10^{-6}/°$ C. in a range of 50 to 300° C. and a dielectric constant of 5 to 8 at a frequency of 1.9 GHz at room temperature. Hence, the low-temperature co-fired ceramic material described in Japanese Patent Laid-Open Application No. 1-132194 is suitable for forming a multilayer wiring board in combination with the low-temperature co-fired ceramic material(III) in accordance with the third embodiment. The low-temperature co-fired ceramic material described in Japanese Patent Laid-Open Application No. 1-132194 includes: 58 to 76 volume % glass component, which has a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; and 24 to 42 volume % alumina as filler. The reason for making the glass component 58 to 76 volume % is as follows: if the glass component is less than 58 volume %, a dense sintered body is not obtained and if the glass component is more than 76 volume %, the content of ceramic component is little and hence a dielectric constant and a coefficient of linear thermal expansion of the low-temperature co-fired ceramic material becomes close to the dielectric constant and the coefficient of linear thermal expansion of the glass component, so that it is difficult to satisfy a dielectric constant and a coefficient of linear thermal expansion required of the other glass-ceramic mixed layer at the same time.

When the other glass-ceramic mixed layers are glass-ceramic mixed layers made of the low-temperature co-fired ceramic material described in Japanese Patent Laid-Open Application No. 1-132194, to make a difference in a coefficient of linear thermal expansion in a range of 50 to 300° C. between the layers not larger than $0.25 \times 10^{-6}/°$ C., preferably $0.10 \times 10^{-6}/°$ C., and to make a difference in a dielectric constant between the layers not less than 2, the content of titania, which is one of ceramic components, is preferably made more than 10 to less than 13 volume %, more preferably 11 to 12 volume % in the glass-ceramic mixed layers made of the low-temperature co-fired ceramic material(III) in accordance with the third embodiment. Further, the content of mullite, which is one of ceramic components, is preferably made more than 22 to less than 30 volume %, more preferably 27.5 to 29.5 volume %. Still further, the content of glass is made not less than 60 to less than 66 volume %, more preferably 60 to 64 volume %. Here, the composition of glass is 47 to 55 mass % $SiO_2$, 1 to 3 mass % $B_2O_3$, 7 to 16.5 mass % $Al_2O_3$, and 30 to 40 mass % alkaline earth metal oxide.

At least one or more layer of the other glass-ceramic mixed layers other than the glass-ceramic mixed layer made of the low-temperature co-fired ceramic material(III) in accordance with the third embodiment is formed of, for example, the low-temperature co-fired ceramic material described in Japanese Patent Laid-Open Application No. 1-132194. Preferably, all the other glass-ceramic mixed layers are formed of the low-temperature co-fired ceramic material described in Japanese Patent Laid-Open Application No. 1-132194.

The manufacturing method described in the multilayer wiring board in accordance with the first embodiment can be applied to a multilayer wiring board in accordance with the third embodiment under the same conditions.

EMBODIMENTS

First Embodiment

Figure 3:
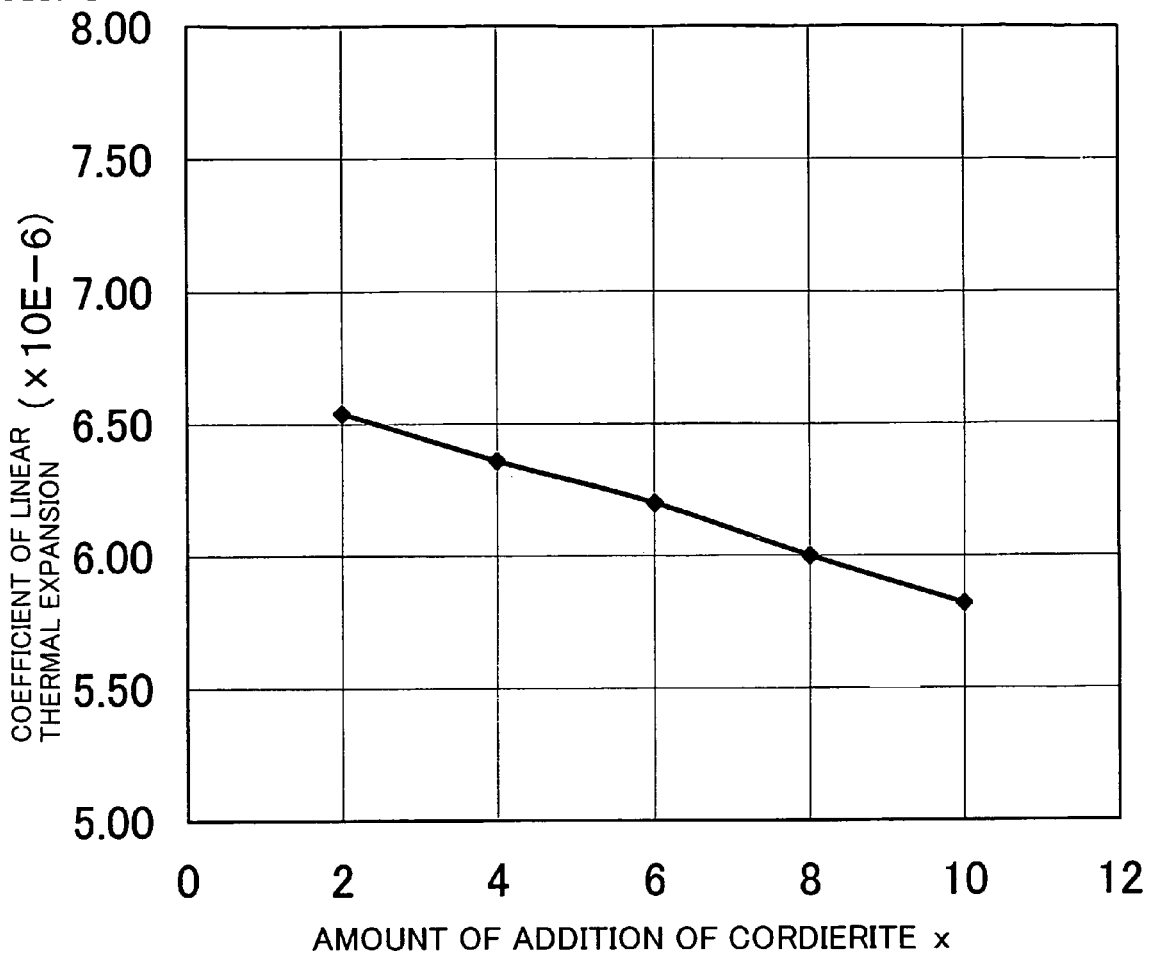
FIG. 3 is a graph showing a change in a coefficient of linear thermal expansion when x is changed in a composition equation of 0.72 glass+0.14 $TiO_2$+(0.14−x) $Al_2O_3$+x $Mg_2Al_4Si_5O_{18}$.
Figure 4:
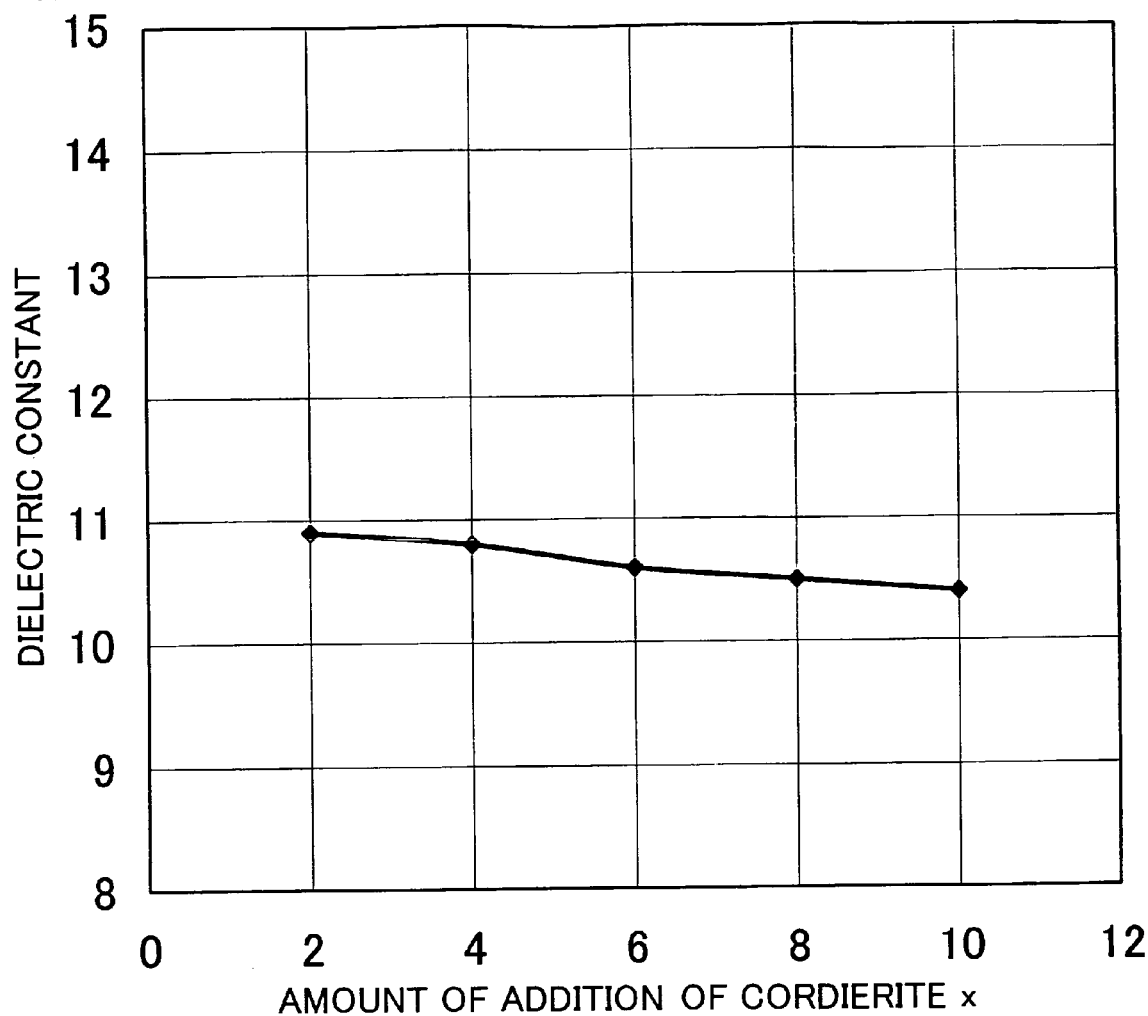
FIG. 4 is a graph showing a change in a dielectric constant when x is changed in a composition equation of 0.72 glass+0.14 $TiO_2$+(0.14−x) $Al_2O_3$+x $Mg_2Al_4Si_5O_{18}$.

Next, the first embodiment will be described in more detail by examples. Powders of glass, alumina, titania, and cordierite were mixed by a ball mill for 16 hours in such a way as to make the composition shown in Table 1. Then, solvent such as toluene and ethanol and binder were added to the mixed powder (mean particle size is 1.5 μm) to prepare paste to produce a coating material. Here, the composition of glass was made 50 mass % $SiO_2$+2 mass % $B_2O_3$+11 mass % $Al_2O_3$+1 mass % MgO+3 mass % CaO+33 mass % SrO in terms of oxide. A ceramic green sheet was formed by the use of this coating material by a doctor blade method. The thickness of the ceramic green sheet was adjusted to be 80 μm after firing. Six ceramic green sheets were laminated, then pressed, and then fired at 850 to 950° C. for 2 hours to produce a multiple-layer substrate of single composition and of 480 μm in thickness. The dielectric constant ∈r at a frequency of 1.9 GHz at room temperature, Q (1/tan δ), coefficient of linear thermal expansion α in a range of 50 to 300° C., and transverse rupture strength of the produced multiple-layer substrate are shown in Table 1. A dielectric constant and tan δ were measured by the use of Network Analyzer (Catalog No. HP8510C) manufactured by HEWLETT PACKARD Ltd. by a perturbation method. A coefficient of linear thermal expansion was measured by the use of Dilatometer (Catalog No. 5000) manufactured by MAC Co. Ltd. Transverse rupture strength was measured by the use of a universal material testing machine (Catalog No. 5543) manufactured by INSTRON Ltd. by a three-point bending method.

alumina has a coefficient of linear thermal expansion of $7.2 \times 10^{-6}$/° C. in a range of 50 to 300° C. and a dielectric constant of 9.8. Hence, when the amount of substitution for substituting cordierite for alumina was increased, as the amount of addition of cordierite was increased, the coefficient of linear thermal expansion was decreased as shown in FIG. 3 and the dielectric constant was decreased as shown in FIG. 4. However, the difference in a dielectric constant between alumina and cordierite is 5.0 and hence a change in a dielectric constant was more moderate as compared with a change in a coefficient of linear thermal expansion. Therefore, it was made clear that the coefficient of linear thermal expansion could be decreased by substituting cordierite for alumina without changing greatly the dielectric constant of the low-temperature co-fired ceramic material.

TABLE 1

|  | COMPOSITION RATIO | | | | | | α | Transverse repture |
| --- | --- | --- | --- | --- | --- | --- | --- | --- |
|  | Glass vol % | Alumina vol % | Titania vol % | Cordierite vol % | ∈r | Q | $(10^{-6}/$° C.$)$ | strength MPa |
| Comparative Example 1 | 72 | 12 | 14 | 2 | 10.9 | 285 | 6.54 | 220 |
| Example 1 | 72 | 10 | 14 | 4 | 10.8 | 284 | 6.36 | 210 |
| Example 2 | 72 | 8 | 14 | 6 | 10.6 | 280 | 6.20 | 200 |
| Example 3 | 72 | 6 | 14 | 8 | 10.5 | 284 | 6.00 | 210 |
| Comparative Example 2 | 72 | 4 | 14 | 10 | 10.4 | 282 | 5.82 | 200 |
| Example 4 | 73 | 4 | 16 | 7 | 11.1 | 280 | 6.20 | 210 |
| Example 5 | 73 | 3 | 17 | 7 | 11.2 | 282 | 6.21 | 190 |
| Example 6 | 73 | 1 | 18 | 8 | 11.4 | 283 | 6.16 | 200 |
| Example 7 | 71 | 1 | 19 | 9 | 11.7 | 283 | 6.14 | 210 |
| Example 8 | 67 | 1 | 21 | 11 | 12.2 | 285 | 6.11 | 195 |
| Example 9 | 63 | 1 | 23 | 13 | 12.8 | 284 | 6.07 | 200 |
| Example 10 | 61 | 1 | 24 | 14 | 13.1 | 285 | 6.06 | 195 |
| Comparative Example 3 | 57 | 1 | 26 | 16 | Dense sintered material was not be obtained | | | |
| Example 11 | 60 | 1 | 25 | 14 | 13.4 | 284 | 6.12 | 210 |
| Example 12 | 60 | 1 | 26 | 13 | 13.8 | 286 | 6.25 | 210 |
| Comparative Example 4 | 60 | 1 | 27 | 12 | 14.2 | 282 | 6.41 | 200 |
| Example 13 | 60 | 1 | 24 | 15 | 13 | 282 | 5.98 | 195 |
| Comparative Example 5 | 60 | 1 | 23 | 16 | 12.7 | 285 | 5.85 | 200 |
| Comparative Example 6 | 60 | 30 | 5 | 5 | 9.3 | 281 | 6.07 | 210 |
| Comparative Example 7 | 60 | 38 | 1 | 1 | 7.7 | 284 | 6.25 | 210 |
| Comparative Example 8 | 60 | 39 | 0.5 | 0.5 | 7.7 | 285 | 6.28 | 190 |
| Example 14 | 78 | 3 | 15 | 4 | 10.8 | 283 | 6.32 | 220 |
| Comparative Example 9 | 80 | 1 | 15 | 4 | 9.69 | 285 | 6.29 | 150 |
| Example 15 | 72 | 13 | 12 | 3 | 10.4 | 282 | 6.37 | 205 |
| Example 16 | 72 | 16 | 10 | 2 | 10.0 | 283 | 6.37 | 210 |
| Comparative Example 10 | 72 | 16 | 9 | 3 | 9.7 | 280 | 6.20 | 200 |

(Control of Coefficient of Linear Thermal Expansion by the Addition of Cordierite-1)

First, when cordierite was substituted for alumina as shown by comparative examples 1 and 2 and examples 1 to 3, that is, when x was changed in a composition equation of 0.72 glass+0.14 TiO$_2$+(0.14−x) Al$_2$O$_3$+x Mg$_2$Al$_4$Si$_5$O$_{18}$, a coefficient of linear thermal expansion was changed as shown in FIG. 3 and a dielectric constant was changed as shown in FIG. 4. Cordierite has a coefficient of linear thermal expansion of $1.8 \times 10^{-6}$/° C. in a range of 50 to 300° C. and a dielectric constant of 4.8. On the other hand, (Control of Coefficient of Linear Thermal Expansion by the Addition of Cordierite-2)

Figure 5:
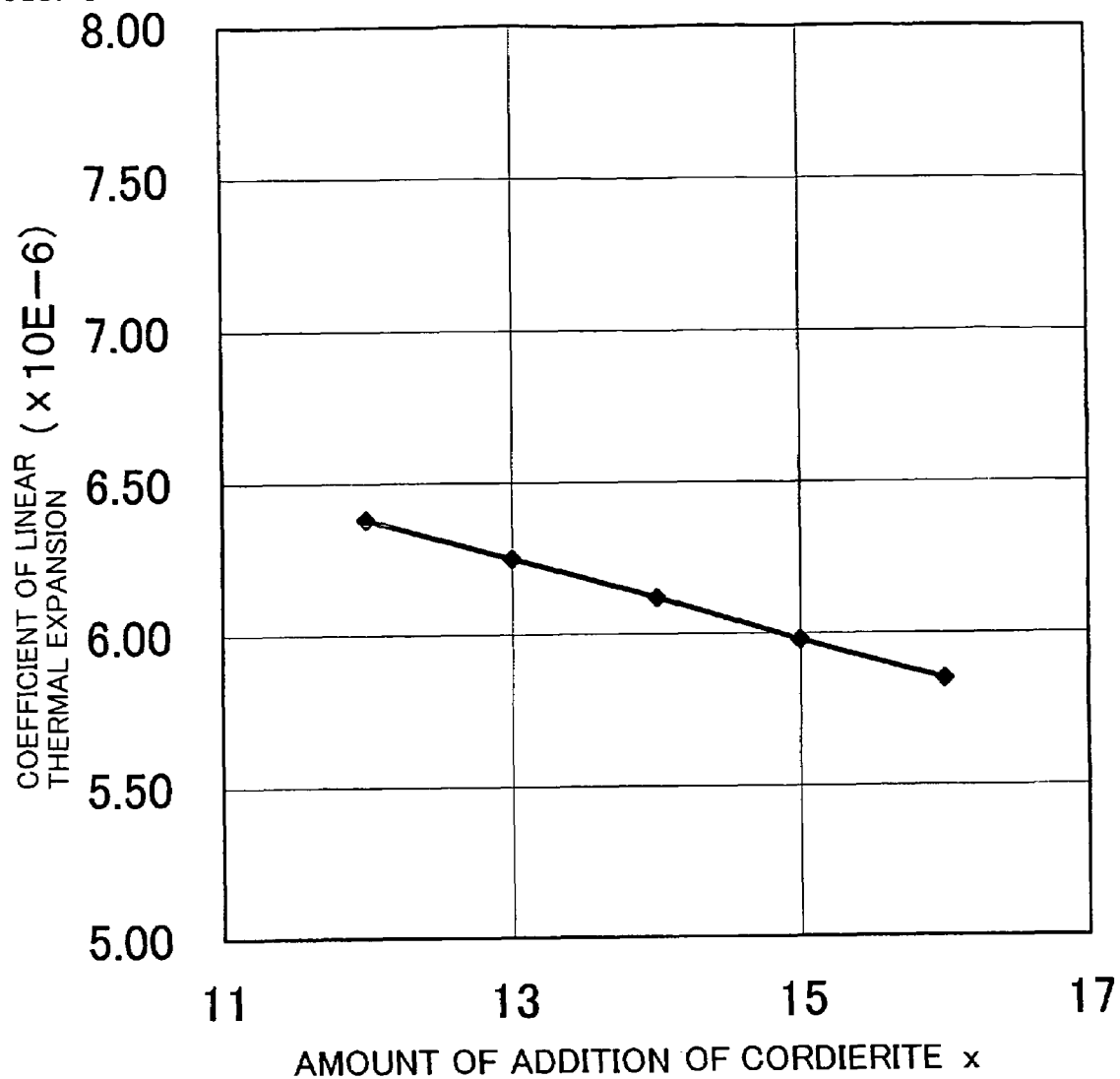
FIG. 5 is a graph showing a change in a coefficient of linear thermal expansion when x is changed in a composition equation of 0.60 glass+(0.39−x) $TiO_2$+0.01 $Al_2O_3$+x $Mg_2Al_4Si_5O_{18}$.
Figure 6:
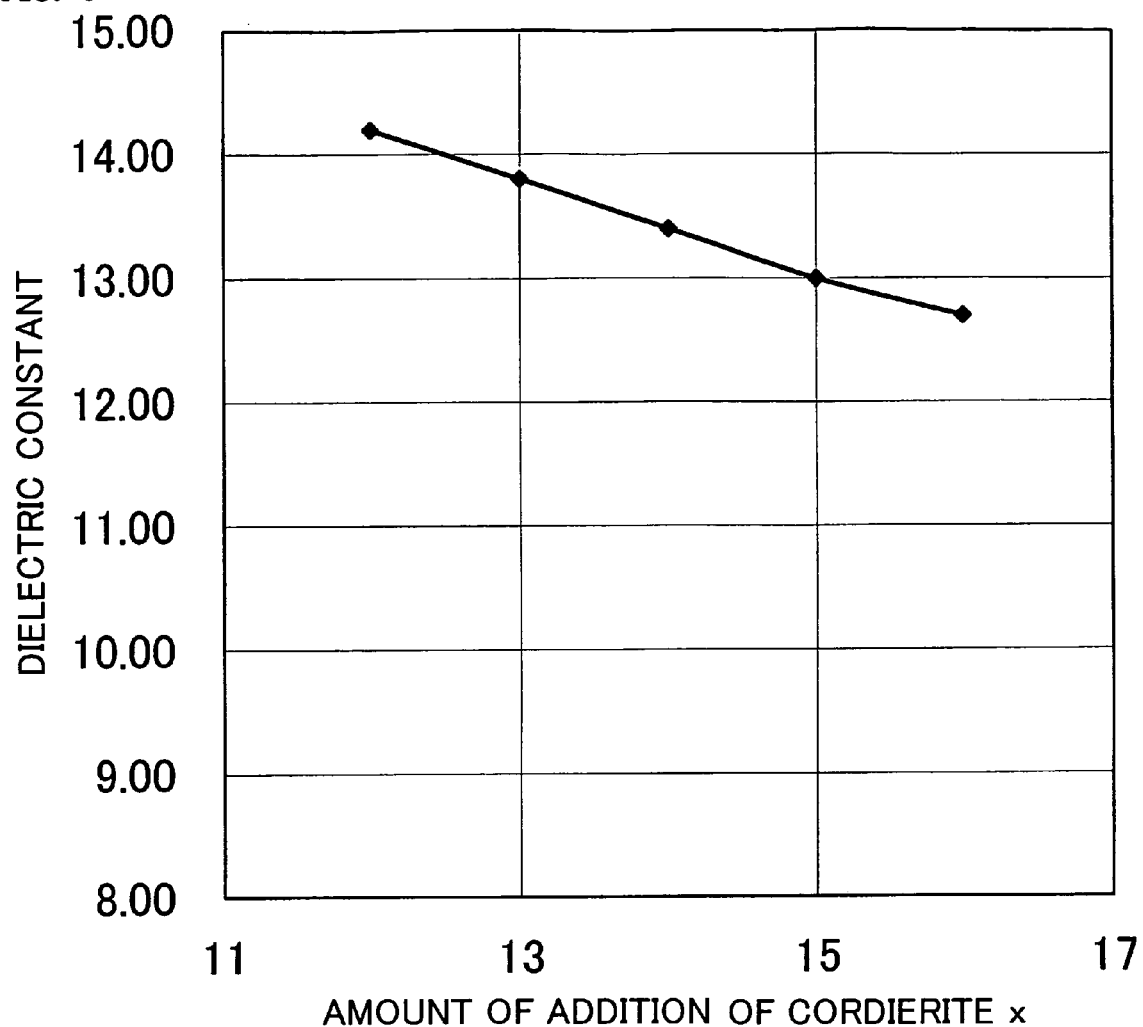
FIG. 6 is a graph showing a change in a dielectric constant when x is changed in a composition equation of 0.60 glass+(0.39−x) $TiO_2$+0.01 $Al_2O_3$+x $Mg_2Al_4Si_5O_{18}$.

Next, when cordierite was substituted for titania as shown by comparative examples 4 and 5 and examples 11 to 13, that is, when x was changed in a composition equation of 0.60 glass+(0.39−x) TiO$_2$+0.01 Al$_2$O$_3$+x Mg$_2$Al$_4$Si$_5$O$_{18}$, the coefficient of linear thermal expansion was changed as shown in FIG. 5 and the dielectric constant was changed as shown in FIG. 6. Cordierite has a coefficient of linear thermal expansion of $1.8 \times 10^{-6}$/° C. in a range of 50 to 300° C. and a dielectric constant of 4.8. On the other hand, titania has a coefficient of linear thermal expansion of 11.5×10$^{-6}$/° C. in a range of 50 to 300° C. and a dielectric constant of 104. Hence, when the amount of substitution for substituting cordierite for titania was increased, as the amount of addition of cordierite was increased, the coefficient of linear thermal expansion was decreased as shown in FIG. 5 and the dielectric constant was decreased as shown in FIG. 6. However, the difference in the dielectric constant between titania and cordierite is 99.2 and a change in the dielectric constant was larger as compared with a change in the dielectric constant shown in FIG. 4. Further, a difference in a coefficient of linear thermal expansion shown in FIG. 5 was as large as that in a case shown in FIG. 3. Therefore, it was made clear that it was possible to decrease the dielectric constant and the coefficient of linear thermal expansion of the low-temperature co-fired ceramic material at the same time by substituting cordierite for titania.

As described above, it was made clear that it was possible to control the coefficient of linear thermal expansion by the addition of cordierite, but the multilayer substrate needs to be a dense sintered body and even if the dense sintered body is obtained, the multilayer substrate needs to have transverse rupture strength not smaller than a predetermined value. Further, the multilayer substrate needs to have a coefficient of linear thermal expansion of 5.9×10$^{-6}$ to 6.4×10$^{-6}$/° C. in a range of 50 to 300° C. and a dielectric constant not less than 10 at a frequency of 1.9 GHz at room temperature. In the comparative example 1, the content of cordierite was only 2 volume % and the coefficient of linear thermal expansion was as high as 6.54×10$^{-6}$/° C. In the comparative example 2, the coefficient of linear thermal expansion was as low as 5.82×10$^{-6}$/° C. In the comparative example 3, the content of glass component was only 57 volume % and hence the dense sintered body cannot be obtained. In the comparative example 4, the content of titania was as high as 27 volume % and hence the coefficient of linear thermal expansion was as high as 6.41×10$^{-6}$/° C. In the comparative example 5, the content of cordierite was as high as 16 volume % and hence the coefficient of linear thermal expansion was as low as 5.80×10$^{-6}$/° C. In the comparative examples 6 to 8, the amount of addition of alumina was large and hence the dielectric constant was less than 10. In the comparative example 9, the content of glass component was 80 volume % and hence transverse rupture strength was low. In the comparative examples 10, the content of titania was as small as 9 volume % and hence the dielectric constant was less than 10.

(Preliminary Study of Warpage of Multiple-Layer Substrate of Different Compositions)

Figure 7:
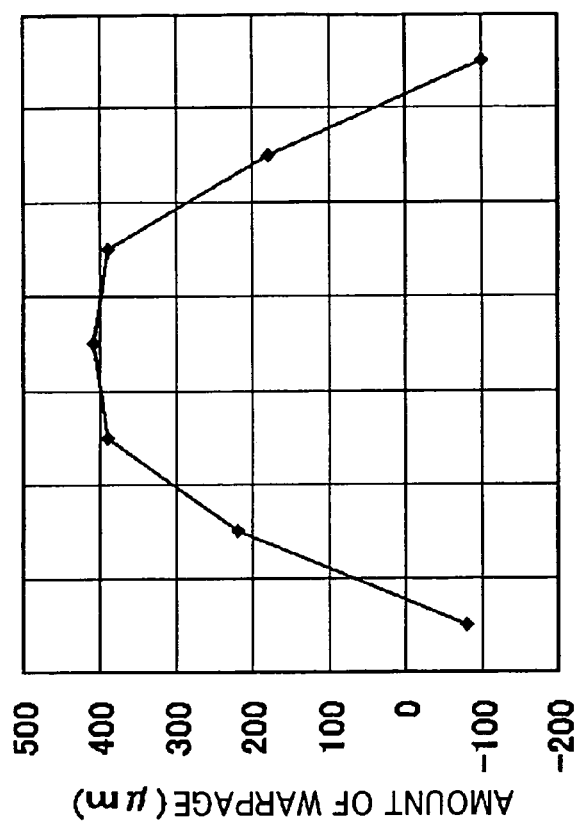
FIG. 7 is a graph showing the relationship between the lamination structure of a multiple-layer substrate and the warpage of the substrate.
Figure 7:
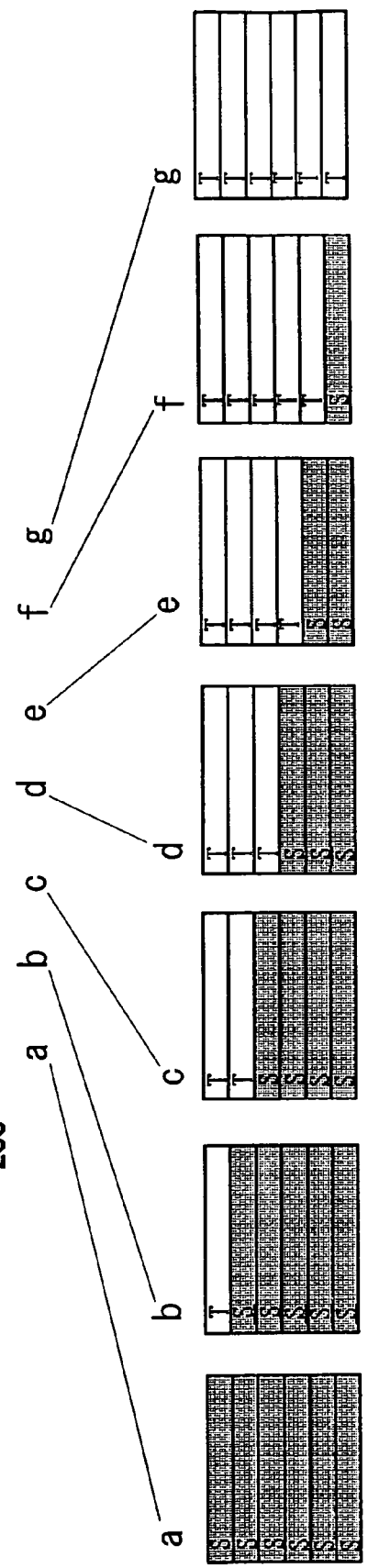

Two kinds of ceramic green sheets of different compositions were formed in 10 mm square, respectively, and a laminated material was formed to have a 6-layer lamination structure. Then, the laminated material was fired at the same time to manufacture a multiple-layer substrate including 6 layers of different compositions and having a thickness of 480 μm. Here, the composition of one glass-ceramic mixed layer was made 70 volume % glass–30 volume % alumina (denoted as S composition) and the composition of other glass-ceramic mixed layer was made 70 volume % glass–15 volume % alumina–15 volume % titania (denoted as T composition). Here, the composition of glass of each layer was made 50 mass % SiO$_2$+2 mass % B$_2$O$_3$+11 mass % Al$_2$O$_3$+1 mass % MgO+3 mass % CaO+33 mass % SrO in terms of oxide. The lamination structure of the multiple-layer substrate was lamination structures shown in FIGS. 7A to 7G. The magnitude of warpage at that time (mean value) is shown in FIG. 7 in combination. Referring to FIG. 7, it is clear that the warpage is the largest in the most unsymmetrical lamination structure shown in FIG. 7D and that the warpage is the smallest in the lamination structures shown in FIGS. 7A and 7G which are multiple-layer substrates having only the same composition.

Figure 1C:
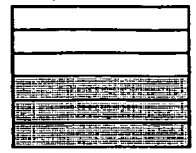
Figure 1D:
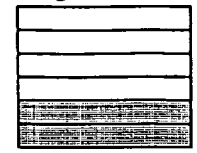
Figure 1E:
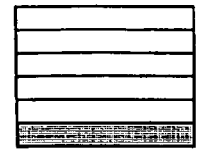
Figure 1F:
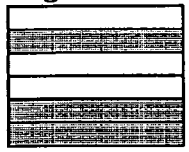
Figure 1G:
Figure 1H:
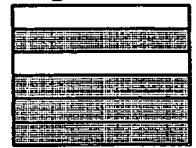
Figure 1I:
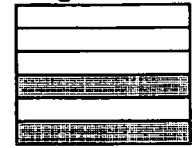
Figure 1J:
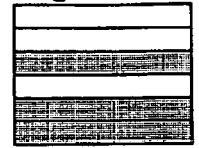
Figure 1K:
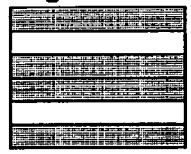
Figure 1L:
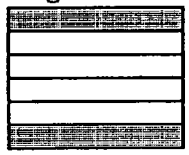
Figure 1M:
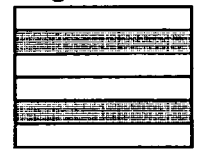
Figure 1N:
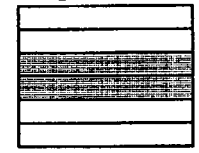
Figure 1O:
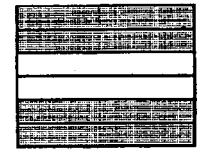
Figures 1, 2:
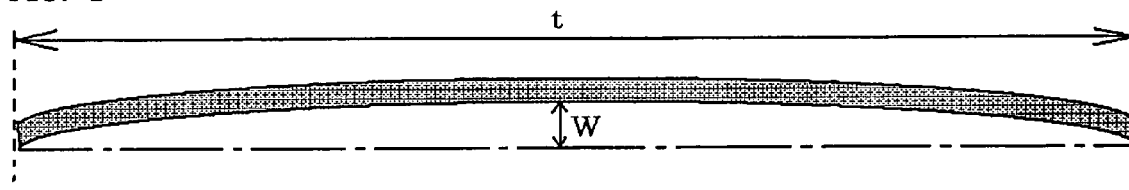
FIG. 2 is a schematic view showing a position when the amount of warpage of the substrate is measured.

From the result shown in FIG. 7, it was found that, of the multiple-layer substrates having the lamination structures shown in FIG. 1, the warpage was the largest in the most unsymmetrical lamination structure shown in FIG. 1C. Hence, thereafter, the lamination structure shown in FIG. 1C was made a target lamination structure to be evaluated. This is because if warpage in the lamination structure shown in FIG. 1C can be made small, warpage in the other lamination structures can be made smaller.

(Study of Warpage of Multiple-Layer Substrate of Different Compositions)

Two kinds of ceramic green sheets of different compositions were formed, respectively, and a laminated material was formed to have a 6-layer lamination structure shown in FIG. 1C. Then, the laminated material was fired at the same time to manufacture a multiple-layer substrate including 6 glass-ceramic mixed layers of different compositions and having a thickness of 480 μm. The multiple-layer substrates of three sizes of 10 mm square, 50 mm square, and 100 mm square were manufactured. Here, the compositions of one glass-ceramic mixed layers were made the respective compositions shown in Table 1. The composition of each of the other glass-ceramic mixed layers was made 70 volume % glass and 30 volume % alumina. Here, the composition of glass of each layer was made 50 mass % SiO$_2$+2 mass % B$_2$O$_3$+11 mass % Al$_2$O$_3$+1 mass % MgO+3 mass % CaO+33 mass % SrO in terms of oxide. Each of the other glass-ceramic mixed layers had a coefficient of linear thermal expansion α of 6.15×10$^{-6}$/° C. in a range of 50 to 300° C. and a dielectric constant of 7.3.

The coefficients of linear thermal expansion a in a range of 50 to 300 of the glass-ceramic mixed layers, the amounts of warpage of the respective substrates of 10 mm square, 50 mm square, and 100 mm square of the multiple-layer substrates, and the evaluations of warpage of the multiple-layer substrates are shown in Table 2. When the warpage of substrate of 50 mm square is not larger than 200 μm, the evaluation of warpage of the multiple-layer substrate is denoted by a symbol of circle (O), and when the warpage of substrate of 50 mm square is more than 200 μm, the evaluation of warpage of the multiple-layer substrate is denoted by a symbol of cross (x). Further, determination whether or not the difference in a dielectric constant between the glass-ceramic mixed layers is not smaller than a predetermined value is added to the evaluation of the multiple-layer substrate. When a multiple-layer substrate satisfies conditions that: the warpage of substrate of 50 mm square is not more than 200 μm; the dielectric constant of one glass-ceramic mixed layer is not smaller than 10; and transverse rupture strength shown in Table 1 is not smaller than 190 MPa, the multiple-layer substrate is given such comprehensive evaluation as a multiple-layer substrate that is denoted by a symbol of circle (O), and when a multiple-layer substrate does not satisfy the conditions, the multiple-layer substrate is given such comprehensive evaluation as a multiple-layer substrate that is denoted by a symbol of cross (x). The results are shown in Table 2.

TABLE 2

| | α (10⁻⁶/° C.) | ∈ r | Warpage μm Substrate of 10 mm square | Warpage μm Substrate of 50 mm square | Warpage μm Substrate of 100 mm square | Evaluation of Warpage | Compreensive Evaluation as multilayer substrate |
|---|---|---|---|---|---|---|---|
| Other glass-ceramic mixed layer | 6.15 | 7.3 | | | | | |
| One glass-ceramic mixed layer | | | | | | | |
| Comparative Example 1 | 6.54 | 10.9 | 65 | 355 | 1422 | X | X |
| Example 1 | 6.36 | 10.8 | 35 | 191 | 766 | ○ | ○ |
| Example 2 | 6.20 | 10.6 | 40 | 54 | 60 | ○ | ○ |
| Example 3 | 6.00 | 10.5 | 38 | 137 | 547 | ○ | ○ |
| Comparative Example 2 | 5.82 | 10.4 | 62 | 301 | 1230 | X | X |
| Example 4 | 6.20 | 11.1 | 38 | 52 | 80 | ○ | ○ |
| Example 5 | 6.21 | 11.2 | 36 | 80 | 219 | ○ | ○ |
| Example 6 | 6.16 | 11.4 | 42 | 58 | 36 | ○ | ○ |
| Example 7 | 6.14 | 11.7 | 30 | 56 | 36 | ○ | ○ |
| Example 8 | 6.11 | 12.2 | 32 | 68 | 146 | ○ | ○ |
| Example 9 | 6.07 | 12.8 | 36 | 85 | 292 | ○ | ○ |
| Example 10 | 6.06 | 13.1 | 36 | 90 | 328 | ○ | ○ |
| Comparative Example 3 | | | Dense sintered body was not be obtained | | | | |
| Example 11 | 6.12 | 13.4 | 32 | 60 | 109 | ○ | ○ |
| Example 12 | 6.25 | 13.8 | 38 | 98 | 365 | ○ | ○ |
| Comparative Example 4 | 6.41 | 14.2 | 42 | 210 | 839 | X | X |
| Example 13 | 5.98 | 13.0 | 38 | 155 | 620 | ○ | ○ |
| Comparative Example 5 | 5.85 | 12.7 | 66 | 273 | 1094 | X | X |
| Comparative Example 6 | 6.07 | 9.3 | 42 | 120 | 292 | ○ | X |
| Comparative Example 7 | 6.25 | 7.7 | 38 | 97 | 365 | ○ | X |
| Comparative Example 8 | 6.28 | 7.7 | 40 | 130 | 474 | ○ | X |
| Example 14 | 6.32 | 10.8 | 41 | 155 | 620 | ○ | ○ |
| Comparative Example 9 | 6.29 | 9.69 | 35 | 128 | 510 | ○ | X |
| Example 15 | 6.37 | 10.4 | 37 | 192 | 755 | ○ | ○ |
| Example 16 | 6.37 | 10.0 | 34 | 189 | 762 | ○ | ○ |
| Comparative Example 10 | 6.2 | 9.7 | 42 | 102 | 369 | ○ | X |

From the results shown in Table 2, it is clear that as the difference in a coefficient of linear thermal expansion between the other glass-ceramic mixed layer and the one glass-ceramic mixed layer is smaller, the warpage of the substrate is smaller. When the other glass-ceramic mixed layer has a coefficient of linear thermal expansion of 6.15×10⁻⁶/° C. in a range of 50 to 300° C. whereas the one glass-ceramic mixed layer has a coefficient of linear thermal expansion of $5.90 \times 10^{-6}$ to $6.40 \times 10^{-6}$/° C. in a range of 50 to 300° C., the warpage of the substrate is small. That is, when a difference in a coefficient of linear thermal expansion is made not larger than $0.25 \times 10^{-6}$/° C., the warpage of the substrate of 50 mm square can be made not larger than 200 μm. More preferably, when a difference in a coefficient of linear thermal expansion is made not larger than $0.1 \times 10^{-6}$/° C., in many cases, the warpage of the substrate of 50 mm square can be made not larger than 100 μm. Still more preferably, when a difference in a coefficient of linear thermal expansion is made not larger than $0.05 \times 10^{-6}$/° C., the warpage of the substrate of 100 mm square can be made not larger than 200 μm. In the comparative examples 1, 2, 4, and 5, a difference in a coefficient of linear thermal expansion is large and the warpage of the substrate is large. In the comparative example 3, a dense sintered body can not be obtained. In the comparative examples 6 to 8 and 10, the warpage of the substrate is small but the difference in a coefficient of linear thermal expansion between the glass-ceramic mixed layers is small, so that it is no use forming two or more kinds of glass-ceramic mixed layers. In the comparative example 9, the difference in a dielectric constant between the glass-ceramic mixed layers is small and the transverse rupture strength of the one glass-ceramic mixed layer is small, so that it is thought that the transverse rupture strength of the multiple-layer substrate itself is also small. As shown in the examples, multiple-layer substrate having the glass-ceramic mixed layers having different dielectric constants and having a small warpage could be manufactured. With this, it is possible to reduce the thickness and size of a module by inserting a high-capacity capacitance into a multiple-layer substrate with high accuracy held and to improve the degree of flexibility in the designing of a substrate.

Second Embodiment

Next, the second embodiment will be described in more detail by examples. Powders of glass, titania, and cordierite were mixed by a ball mill for 16 hours in such a way as to make the composition shown in Table 3. Then, solvent such as toluene and ethanol and binder were added to the mixed powder (mean particle size is 1.5 μm) to prepare paste to produce a coating material. Here, the composition of glass was made 50 mass % $SiO_2$+2 mass % $B_2O_3$+11 mass % $Al_2O_3$+1 mass % MgO+3 mass % CaO+33 mass % SrO in terms of oxide. A ceramic green sheet was formed by the use of this coating material by a doctor blade method. The thickness of the ceramic green sheet was adjusted to be 80 μm after firing. Six ceramic green sheets were laminated, then pressed, and then fired at 850 to 950° C. for 2 hours to produce a multiple-layer substrate of single composition and of 480 μm in thickness. The dielectric constant ∈r at a frequency of 1.9 GHz at room temperature, Q (1/tan δ), coefficient of linear thermal expansion α in a range of 50 to 300° C., and transverse rupture strength of the produced multiple-layer substrate are shown in Table 3. Here, the dielectric constant, tan δ, the coefficient of linear thermal expansion, and the transverse rupture strength were measured by the machine and the measuring method as described in the examples of the first embodiment.

low-temperature co-fired ceramic material with its dielectric constant kept at a value not smaller than 10 by substituting cordierite for titania.

As described above, it was made clear that it was possible to control the coefficient of linear thermal expansion by the addition of cordierite, but the multilayer substrate needs to

TABLE 3

| | COMPOSITION RATE | | | | | | Transverse rupture |
|---|---|---|---|---|---|---|---|
| | Glass vol % | Titania vol % | Cordierite vol % | ∈ r | Q | α (10⁻⁶/° C.) | strength (MPa) |
| Exapmle 17 | 60 | 27 | 13 | 14.6 | 280 | 6.29 | 200 |
| Comparative Example 11 | 60 | 28 | 12 | 15.0 | 280 | 6.42 | 210 |
| Exapmle 18 | 60 | 25 | 15 | 13.8 | 285 | 6.03 | 200 |
| Exapmle 19 | 60 | 24.5 | 15.5 | 13.7 | 286 | 5.96 | 220 |
| Comparative Example 12 | 60 | 24 | 16 | 13.5 | 284 | 5.87 | 210 |
| Exapmle 20 | 74 | 20 | 6 | 12.2 | 285 | 6.20 | 210 |
| Exapmle 21 | 70 | 21 | 9 | 12.7 | 282 | 6.24 | 220 |
| Exapmle 22 | 66 | 23 | 11 | 13.3 | 285 | 6.21 | 230 |
| Exapmle 23 | 62 | 25 | 13 | 13.9 | 281 | 6.18 | 210 |
| Comparative Example 13 | 58 | 27 | 15 | Dense sinterd body was not be obtained | | | |
| Comparative Example 14 | 78 | 18 | 4 | 12.0 | 284 | 6.44 | 195 |
| Exapmle 24 | 78 | 17 | 5 | 12.0 | 285 | 6.31 | 200 |
| Exapmle 25 | 78 | 16 | 6 | 11.4 | 284 | 6.18 | 190 |
| Exapmle 26 | 78 | 15 | 7 | 11.0 | 283 | 6.05 | 200 |
| Exapmle 27 | 78 | 14 | 8 | 10.7 | 288 | 5.91 | 195 |
| Comparative Example 15 | 78 | 13 | 9 | 10.5 | 282 | 5.78 | 200 |
| Comparative Example 16 | 80 | 15 | 5 | 11.1 | 285 | 6.20 | 150 |

(Control of Coefficient of Linear Thermal Expansion by the Addition of Cordierite-1)

Figure 8:
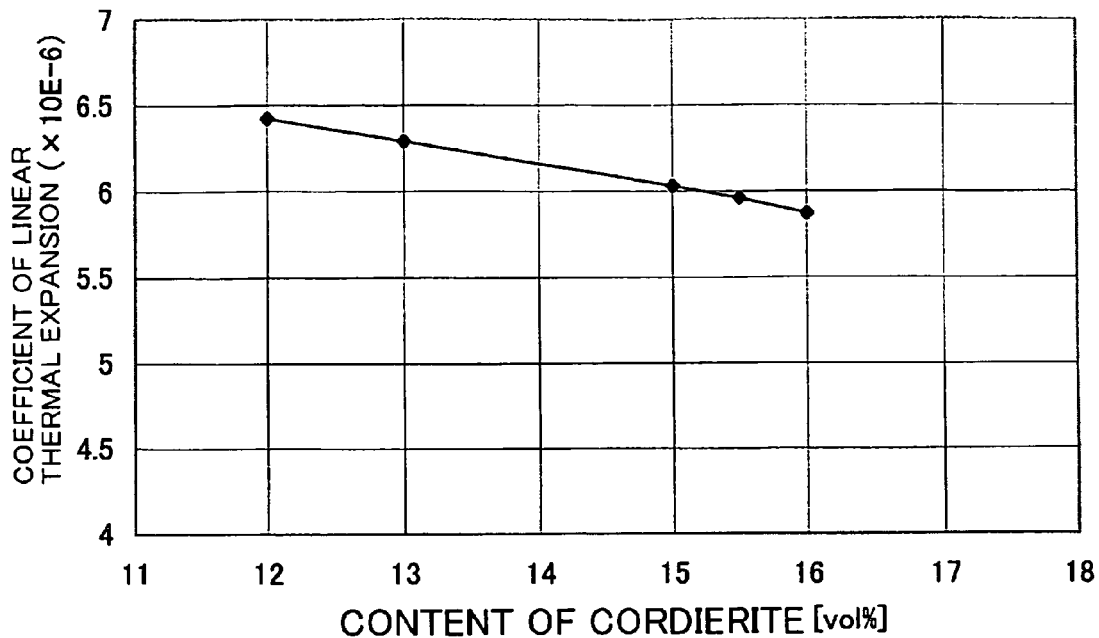
FIG. 8 is a graph showing a change in a coefficient of linear thermal expansion when x is changed in a composition equation of 0.60 glass+(0.40−x) $TiO_2$+x $Mg_2Al_4Si_5O_{18}$.
Figure 9:
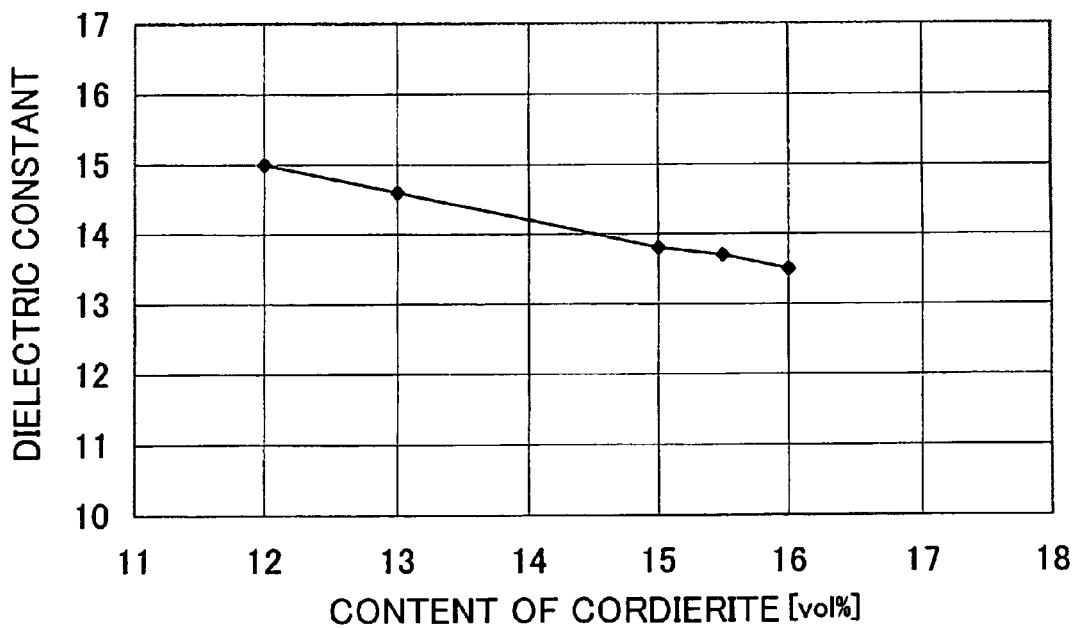
FIG. 9 is a graph showing a change in a dielectric constant when x is changed in a composition equation of 0.60 glass+(0.40−x) $TiO_2$+x $Mg_2Al_4Si_5O_{18}$.
Figure 10:
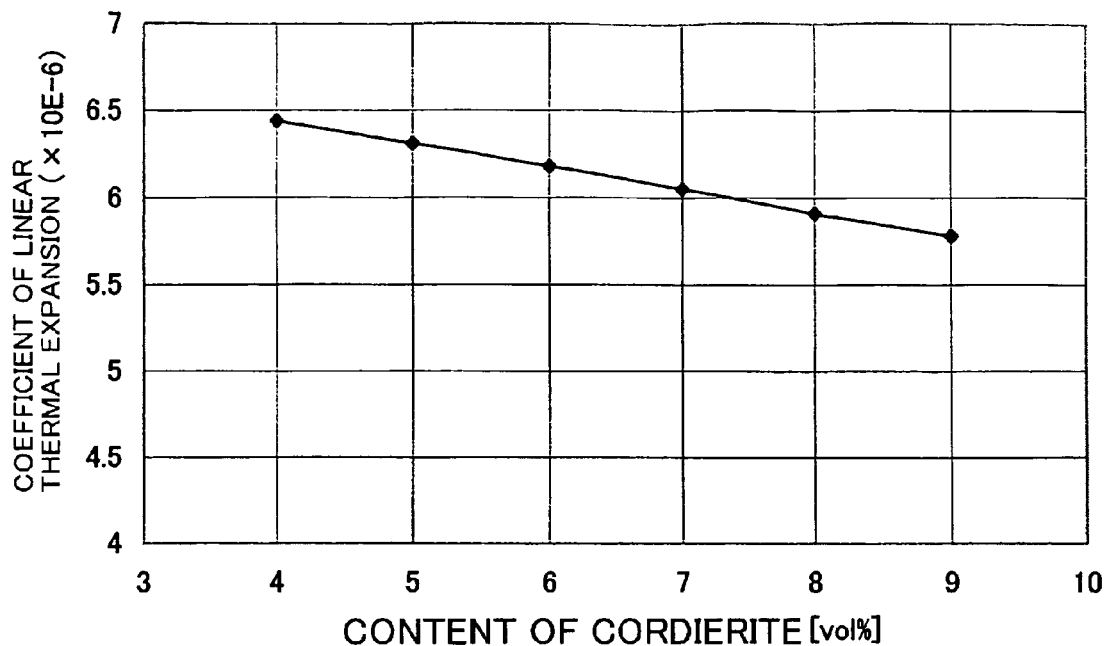
FIG. 10 is a graph showing a change in a coefficient of linear thermal expansion when x is changed in a composition equation of 0.78 glass+(0.22−x) $TiO_2$+x $Mg_2Al_4Si_5O_{18}$.
Figure 11:
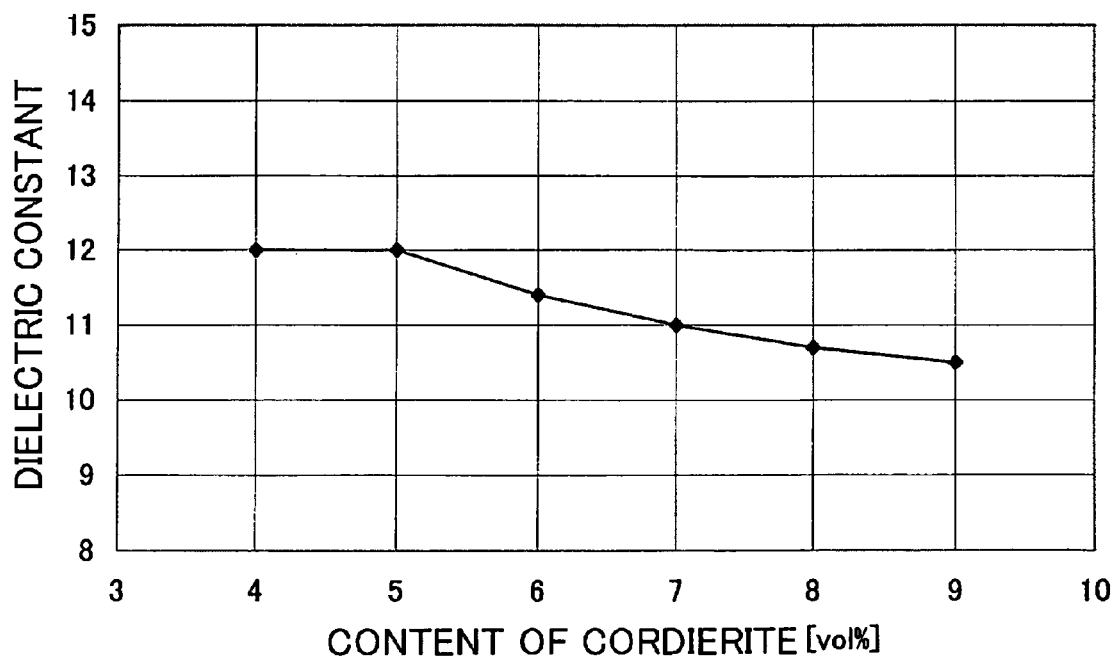
FIG. 11 is a graph showing a change in a dielectric constant when x is changed in a composition equation of 0.78 glass+(0.22−x) $TiO_2$+x $Mg_2Al_4Si_5O_{18}$.

First, when cordierite was substituted for alumina as shown by comparative examples 11 and 12 and examples 17 to 19, that is, when x was changed in a composition equation of $0.60$ glass$+(0.40-x)$ $TiO_2+x$ $Mg_2Al_4Si_5O_{18}$, the coefficient of linear thermal expansion was changed as shown in FIG. 8 and the dielectric constant was changed as shown in FIG. 9. Further, when cordierite was substituted for titania as shown by comparative examples 14 and 15 and examples 24 to 27, that is, when x was changed in a composition equation of $0.78$ glass$+(0.22-x)$ $TiO_2+x$ $Mg_2Al_4Si_5O_{18}$, the coefficient of linear thermal expansion was changed as shown in FIG. 10 and the dielectric constant was changed as shown in FIG. 11. Cordierite has a coefficient of linear thermal expansion of $1.8 \times 10^{-6}/°$ C. in a range of 50 to 300° C. and a dielectric constant of 4.8. On the other hand, titania has a coefficient of linear thermal expansion of $11.5 \times 10^{-6}/°$ C. in a range of 50 to 300° C. and a dielectric constant of 104. Hence, when the amount of substitution for substituting cordierite for titania was increased, as the amount of addition of cordierite was increased, the coefficient of linear thermal expansion was decreased as shown in FIGS. 8, 10 and the dielectric constant was decreased as shown in FIGS. 9, 11. However, in a case where cordierite is added in a range shown in FIG. 9, the dielectric constant is not smaller than 13.5 and in a case where cordierite is added in the range shown in FIG. 11, the dielectric constant is not smaller than 10.5. Hence, in either of these two cases, it is possible to make the substrate have a dielectric constant not smaller than 10. Therefore, it was made clear that it was possible to decrease the coefficient of linear thermal expansion of the be a dense sintered body and even if the dense sintered body can be obtained, the multilayer substrate needs to have rupture strength not smaller than a predetermined value. Further, the multilayer substrate needs to have a coefficient of linear thermal expansion of $5.9 \times 10^{-6}$ to $6.4 \times 10^{-6}/°$ C. in a range of 50 to 300° C. and a dielectric constant not smaller than 10 at a frequency of 1.9 GHz at room temperature. In the comparative example 14, only 4 volume % cordierite was contained and the coefficient of linear thermal expansion was as high as $6.44 \times 10^{-6}/°$ C. In the comparative example 12, the content of cordierite was as high as 16 volume % and the coefficient of linear thermal expansion was as low as $5.87 \times 10^{-6}/°$ C. In the comparative example 11, the content of titania was as high as 28 volume % and hence the coefficient of linear thermal expansion was as high as $6.42 \times 10^{-6}/°$ C. In the comparative example 13, the content of glass component was only 58 volume % and firing was not performed. In the comparative example 15, the content of titania was only 13 volume % and hence the coefficient of linear thermal expansion was as low as $5.78 \times 10^{-6}/°$ C. and hence the dense sintered body can not be obtained. In the comparative example 16, the content of glass component was 80 volume % and hence transverse rupture strength was low.

(Preliminary Study of Warpage of Multiple-Layer Substrate of Different Compositions)

While the preliminary study of warpage of multiple-layer substrate of different compositions has been performed in the examples in the first embodiment, also in the examples of the second embodiment, similarly, the lamination structure shown in FIG. 1C will be evaluated below.

(Study of Warpage of Multiple-Layer Substrate of Different Compositions)

Two kinds of ceramic green sheets of different compositions were formed, respectively, and a laminated material was formed to have a 6-layer lamination structure shown in FIG. 1C. Then, the laminated material was fired at the same time to manufacture a multiple-layer substrate including 6 glass-ceramic mixed layers of different compositions and having a thickness of 480 μm. The multiple-layer substrates of three sizes of 10 mm square, 50 mm square, and 100 mm square were manufactured. Here, the compositions of one glass-ceramic mixed layers were made the respective compositions shown in Table 3. The composition of each of the other glass-ceramic mixed layers was made 70 volume % the difference in a dielectric constant between the glass-ceramic mixed layers is not smaller than a predetermined value is added to the evaluation of the multiple-layer substrate. When a multiple-layer substrate satisfies conditions that: the warpage of substrate of 50 mm square is not larger than 200 μm; the dielectric constant of one glass-ceramic mixed layer is not smaller than 10; and the transverse rupture strength shown in Table 3 is not smaller than 190 MPa, the multiple-layer substrate is given such comprehensive evaluation as a multiple-layer substrate that is denoted by a symbol of circle (O), and when a multiple-layer substrate does not satisfy the conditions, the multiple-layer substrate is given such comprehensive evaluation as a multiple-layer substrate that is denoted by a symbol of cross (x). The results are shown in Table 4.

TABLE 4

|  | α ($10^{-6}$/° C.) | ε r | Warpage (μm) Substrate of 10 mm square | Warpage (μm) Substrate of 50 mm square | Warpage (μm) Substrate of 100 mm square | Evaluation of warpage | Comprehensive evaluation as multilayer substrate |
|---|---|---|---|---|---|---|---|
| Other glass-ceramic mixed layer | 6.15 | 7.3 | | | | | |
| One glass-ceramic mixed layer | | | | | | | |
| Example 17 | 6.29 | 14.6 | 40 | 128 | 510 | O | O |
| Comparative Example 11 | 6.42 | 15.0 | 39 | 246 | 984 | X | X |
| Example 18 | 6.03 | 13.8 | 42 | 109 | 437 | O | O |
| Example 19 | 5.96 | 13.7 | 72 | 173 | 693 | O | O |
| Comparative Example 12 | 5.87 | 13.5 | 102 | 237 | 948 | X | X |
| Example 20 | 6.20 | 12.2 | 39 | 85 | 182 | O | O |
| Example 21 | 6.24 | 12.7 | 41 | 95 | 328 | O | O |
| Example 22 | 6.21 | 13.3 | 36 | 90 | 219 | O | O |
| Example 23 | 6.18 | 13.9 | 38 | 65 | 109 | O | O |
| Comparative Example 13 | | | Dense sintered body was not be obtained | | | | |
| Comparative Example 14 | 6.44 | 12.0 | 95 | 264 | 1057 | X | X |
| Example 24 | 6.31 | 12.0 | 45 | 146 | 583 | O | O |
| Example 25 | 6.18 | 11.4 | 42 | 55 | 109 | O | O |
| Example 26 | 6.05 | 11.0 | 38 | 98 | 365 | O | O |
| Example 27 | 5.91 | 10.7 | 125 | 192 | 875 | O | O |
| Comparative Example 15 | 5.78 | 10.5 | 136 | 337 | 1349 | X | X |
| Comparative Example 16 | 6.20 | 11.1 | 41 | 85 | 182 | O | X | glass and 30 volume % alumina. Here, the composition of glass of each layer was made 50 mass % $SiO_2$+2 mass % $B_2O_3$+11 mass % $Al_2O_3$+1 mass % MgO+3 mass % CaO+33 mass % SrO in terms of oxide. Each of the other glass-ceramic mixed layers had a coefficient of linear thermal expansion a of $6.15\times10^{-6}$/° C. in a range of 50 to 300° C. and a dielectric constant of 7.3.

The coefficient of linear thermal expansion a in a range of 50 to 300° C. of the glass-ceramic mixed layer, the amounts of warpage of the substrates of 10 mm square, 50 mm square, and 100 mm square of the multiple-layer substrates, and the evaluations of warpage of the multiple-layer substrates are shown in Table 4. When the warpage of substrate of 50 mm square is not larger than 200 μm, the evaluation of warpage of the multiple-layer substrate is denoted by a symbol of circle (O), and when the warpage of substrate of 50 mm square is more than 200 μm, the evaluation of warpage of the multiple-layer substrate is denoted by a symbol of cross (x). Further, determination whether or not From the results shown in Table 4, it is clear that as the difference in a coefficient of linear thermal expansion between the other glass-ceramic mixed layer and the one glass-ceramic mixed layer is smaller, the warpage of the substrate is smaller. When the other glass-ceramic mixed layer has a coefficient of linear thermal expansion of $6.15\times10^{-6}$/° C. in a range of 50 to 300° C. whereas the one glass-ceramic mixed layer has a coefficient of linear thermal expansion of $5.90\times10^{-6}$ to $6.40\times10^{-6}$/° C. in a range of 50 to 300° C., the warpage of the substrate is small. That is, when a difference in a coefficient of linear thermal expansion is made not larger than $0.25\times10^6$/° C., the warpage of the substrate of 50 mm square can be made not larger than 200 μm. More preferably, when a difference in a coefficient of linear thermal expansion is made not larger than $0.1\times10^{-6}$/° C., the warpage of the substrate of 50 mm square can be made not larger than 100 μm. Still more preferably, when a difference in a coefficient of linear thermal expansion is made not larger than $0.05\times10^{-6}$/° C., the warpage of the substrate of 100 mm square can be made not larger than 200 μm. In the comparative examples 11, 12, 14, and 15, a difference in a coefficient of linear thermal expansion is large and the warpage of the substrate is large. In the comparative example 13, a dense sintered body can not be obtained. In the comparative examples 16, the transverse rupture strength of the one glass-ceramic mixed layer is small, so that it is thought that the transverse rupture strength of the multiple-layer substrate itself is also small. As shown in the examples, multiple-layer substrate having the glass-ceramic mixed layers having different dielectric constants and having a small warpage could be manufactured. With this, it is possible to reduce the thickness and size of a module by inserting a high-capacity capacitance into a multiple-layer substrate with high accuracy held and to improve the degree of flexibility in the designing of a substrate.

Third Embodiment

Next, the third embodiment will be described in more detail by examples. Powders of glass, titania, and mullite were mixed by a ball mill for 16 hours in such a way as to make the composition shown in Table 5. Then, solvent such as toluene and ethanol and binder were added to the mixed powder (mean particle size is 1.5 μm) to prepare paste to produce a coating material. Here, the composition of glass was made 50 mass % $SiO_2$+2 mass % $B_2O_3$+11 mass % $Al_2O_3$+1 mass % MgO+3 mass % CaO+33 mass % SrO in terms of oxide. A ceramic green sheet was formed by the use of this coating material by a doctor blade method. The thickness of the ceramic green sheet was adjusted to be 80 μm after firing. Six ceramic green sheets were laminated, then pressed, and then fired at 850 to 950° C. for 2 hours to produce a multiple-layer substrate of single composition and of 480 μm in thickness. The dielectric constant ∈r at a frequency of 1.9 GHz at room temperature, Q (1/tan δ), and coefficient of linear thermal expansion α in a range of 50 to 300° C. of the produced multiple-layer substrate are shown in Table 5. Here, the dielectric constant, tan δ, and the coefficient of linear thermal expansion were measured by the machine and the measuring method as described in the examples of the first embodiment.

TABLE 5

| | COMPOSITION RATE | | | | | α |
|---|---|---|---|---|---|---|
| | Glass vol % | Titania vol % | mullite vol % | ∈r | Q | (10⁻⁶/° C.) |
| Comparative Example 17 | 58 | 12 | 30 | Dense sintered body was not be obtained | — | — |
| Example 28 | 60 | 12 | 28 | 10.4 | 285 | 6.36 |
| Example 29 | 62 | 12 | 26 | 10.3 | 283 | 6.38 |
| Example 30 | 64 | 12 | 24 | 10.3 | 286 | 6.39 |
| Example 31 | 65 | 12 | 23 | 10.3 | 289 | 6.40 |
| Comparative Example 18 | 66 | 12 | 22 | 10.3 | 281 | 6.41 |
| Example 32 | 60 | 11 | 29 | 10.1 | 288 | 6.29 |
| Example 33 | 60 | 10.5 | 29.5 | 10.0 | 284 | 6.26 |
| Comparative Example 19 | 60 | 10 | 30 | 9.8 | 289 | 6.23 |
| Example 34 | 60 | 12.5 | 27.5 | 10.4 | 283 | 6.39 |
| Comparative Example 20 | 60 | 13 | 27 | 10.6 | 284 | 6.42 |

(Control of Coefficient of Linear Thermal Expansion by the Addition of Mullite)

Figure 12:
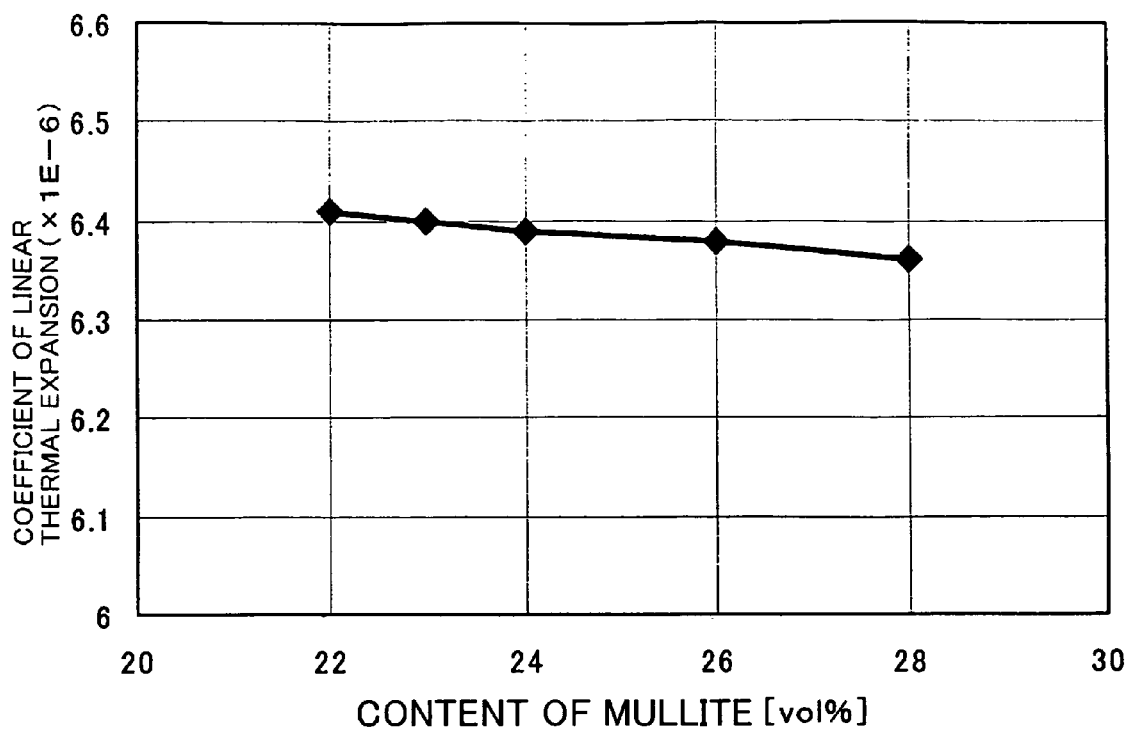
FIG. 12 is a graph showing a change in a coefficient of linear thermal expansion when x is changed in a composition equation of (0.88−x) glass +0.12 $TiO_2$+x $Al_6Si_2O_{13}$.
Figure 13:
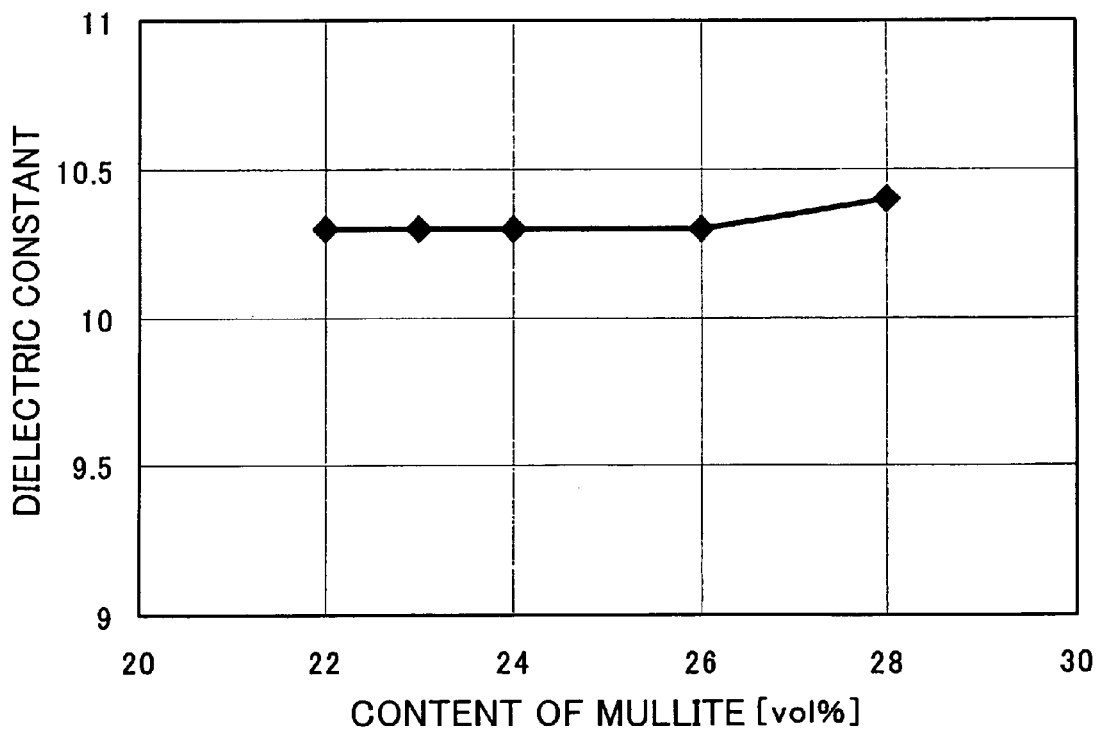
FIG. 13 is a graph showing a change in a dielectric constant when x is changed in a composition equation of (0.88−x) glass+0.12 $TiO_2$+x $Al_6Si_2O_{13}$.
Figure 14:
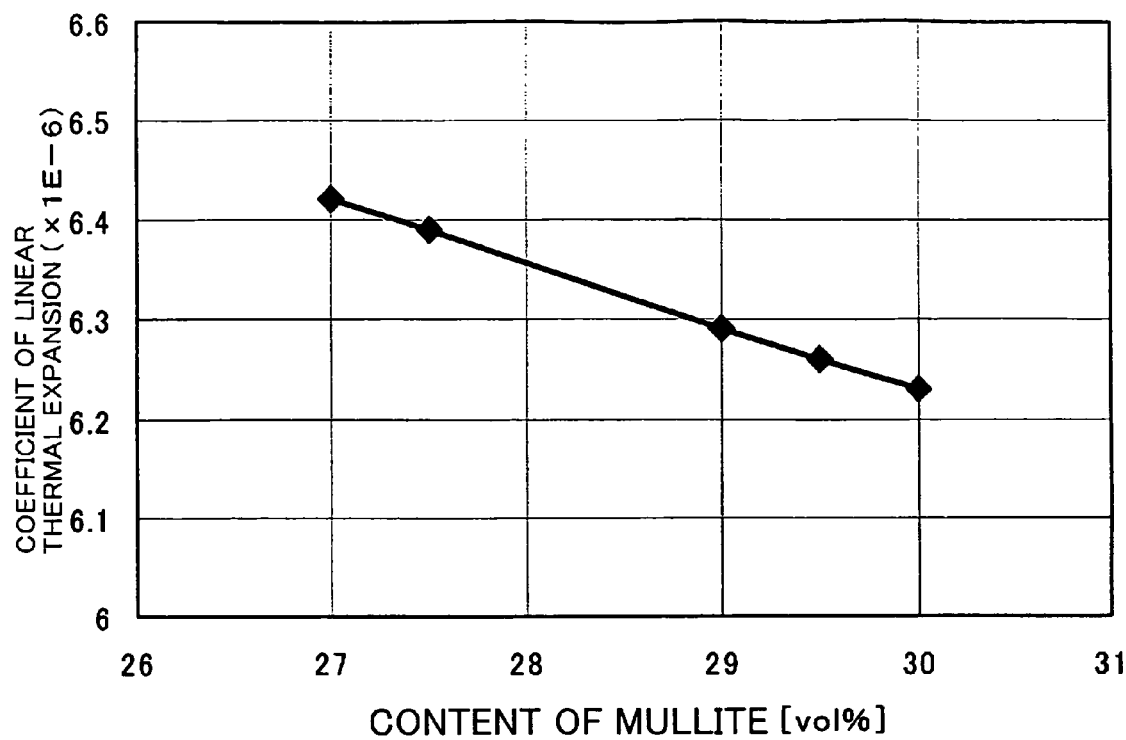
FIG. 14 is a graph showing a change in a coefficient of linear thermal expansion when x is changed in a composition equation of 0.60 glass+(0.40−x) $TiO_2$+x $Al_6Si_2O_{13}$.
Figure 15:
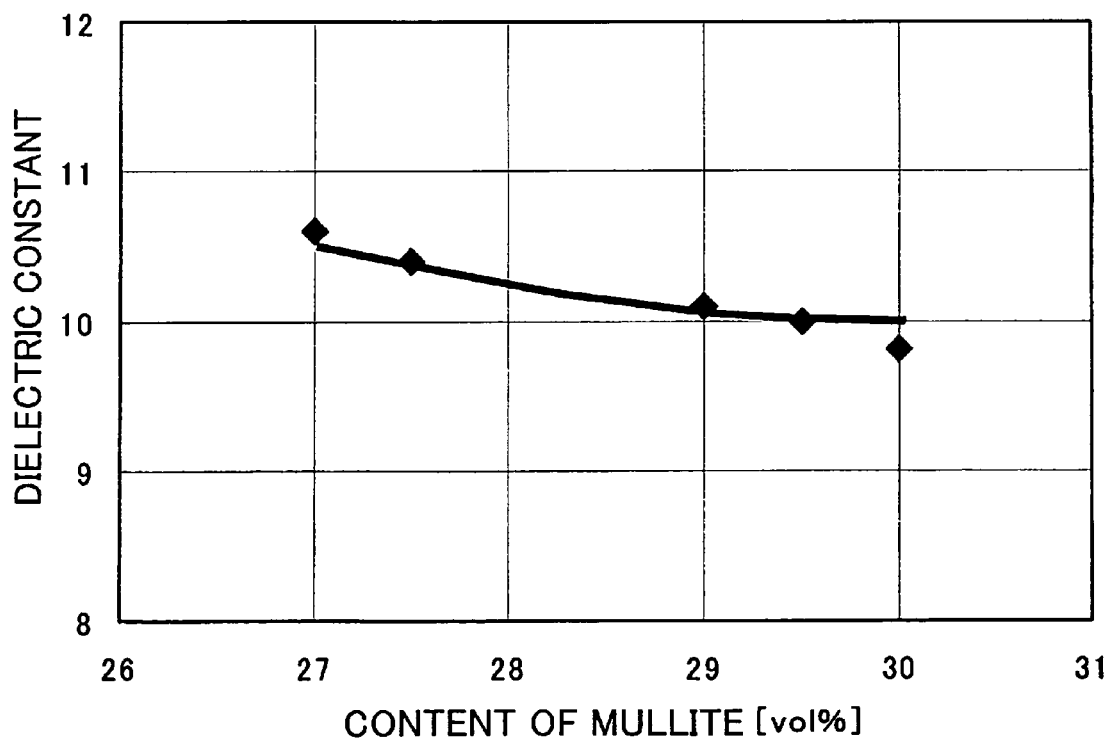
FIG. 15 is a graph showing a change in a dielectric constant when x is changed in a composition equation of 0.60 glass+(0.40−x) $TiO_2$+x $Al_6Si_2O_{13}$.

First, when mullite was substituted for glass as shown by comparative examples 17 and 18 and examples 28 to 31, that is, when x was changed in a composition equation of (0.88−x) glass+0.12 $TiO_2$+x $Al_6Si_2O_{13}$, the coefficient of linear thermal expansion was changed as shown in FIG. 12 and the dielectric constant was changed as shown in FIG. 13. Further, when mullite was substituted for titania as shown by comparative examples 19 and 20 and examples 32 to 34, that is, when x was changed in a composition equation of 0.60 glass+(0.40−x) $TiO_2$+x $Al_6Si_2O_{13}$, the coefficient of linear thermal expansion was changed as shown in FIG. 14 and the dielectric constant was changed as shown in FIG. 15. Mullite has a coefficient of linear thermal expansion of 5.0×10⁻⁶/° C. in a range of 50 to 300° C. and a dielectric constant of 7.4. On the other hand, glass used in this example has a coefficient of linear thermal expansion of 5.7×10⁻⁶/° C. in a range of 50 to 300° C. and a dielectric constant of 6.4. Hence, when the amount of substitution for substituting mullite for glass was increased, as the amount of addition of mullite was increased, the coefficient of linear thermal expansion was decreased as shown in FIG. 12, but the dielectric constant was not affected by the increased amount of addition of mullite as shown in FIG. 13. On the other hand, titania has a coefficient of linear thermal expansion of 11.5×10⁻⁶/° C. in a range of 50 to 300° C. and a dielectric constant of 104. Hence, when the amount of substitution for substituting mullite for titania was increased, as the amount of addition of mullite was increased, the coefficient of linear thermal expansion was decreased as shown in FIG. 14 and the dielectric constant was decreased as shown in FIG. 15. However, in a case where the content of mullite is less than 30 volume % in FIG. 15, the dielectric constant is not smaller than 10, it is possible to make the substrate have a dielectric constant not smaller than 10. Therefore, it was made clear that it was possible to decrease the coefficient of linear thermal expansion of the low-temperature co-fired ceramic material with its dielectric constant kept at a value not smaller than 10 by substituting mullite for glass or titania.

As described above, it was made clear that it was possible to control coefficient of linear thermal expansion by the addition of mullite, but the low-temperature co-fired ceramics substrate needs to be a dense sintered body. Further, the low-temperature co-fired ceramics substrate needs to have a coefficient of linear thermal expansion of 5.9×10⁻⁶ to 6.4×10⁻⁶/° C. in a range of 50 to 300° C. and a dielectric constant not smaller than 10 at a frequency of 1.9 GHz at room temperature. In the comparative example 17, the content of glass component was as small as 58 volume % and hence a dense sintered body could not be obtained. In the comparative 18, the content of mullite was 22 volume % and the coefficient of linear thermal expansion was as high as 6.41×10⁻⁶/° C. In the comparative example 19, the content of mullite was 30 volume % and the dielectric constant was as low as 9.8. In the comparative example 20, the content of titania was 13 volume % and the coefficient of linear thermal expansion was as high as 6.42×10⁻⁶/° C.

(Preliminary Study of Warpage of Multiple-Layer Substrate of Different Compositions)

While the preliminary study of warpage of multiple-layer substrate of different compositions has been performed in the examples in the first embodiment, also in the examples of the third embodiment, similarly, the lamination structure shown in FIG. 1C will be evaluated below.

(Study of Warpage of Multiple-Layer Substrate of Different Compositions)

Two kinds of ceramic green sheets of different compositions were formed, respectively, and a laminated material was formed to have the 6-layer lamination structure shown in FIG. 1C. Then, the laminated material was fired at the same time to manufacture a multiple-layer substrate including 6 glass-ceramic mixed layers of different compositions and having a thickness of 480 μm. The multiple-layer substrates of two sizes of 10 mm square and 50 mm square were manufactured. Here, the compositions of one glass-ceramic mixed layers were made the respective compositions shown in Table 5. The composition of each of the other glass-ceramic mixed layers was made 70 volume % glass and 30 volume % alumina. Here, the composition of glass of each of the glass-ceramic mixed layers was made 50 mass % $SiO_2$+2 mass % $B_2O_3$+11 mass % $Al_2O_3$+1 mass % MgO+3 mass % CaO+33 mass % SrO in terms of oxide. Each of the other glass-ceramic mixed layers had a coefficient of linear thermal expansion of $6.15\times10^{-6}/°$ C. in a range of 50 to 300° C. and a dielectric constant of 7.3.

The coefficients of linear thermal expansion a of the glass-ceramic mixed layers in a range of 50 to 300, the amounts of warpage of the substrate of 10 mm square and 50 mm square of the multiple-layer substrates, and the evaluations of warpage of the multiple-layer substrates are shown in Table 6. When the warpage of substrate of 50 mm square is not larger than 200 μm, the evaluation of warpage of the multiple-layer substrate is denoted by a symbol of circle (O), and when the warpage of substrate of 50 mm square is larger than 200 μm, the evaluation of warpage of the multiple-layer substrate is denoted by a symbol of cross (x). Further, determination whether or not the difference in a dielectric constant ∈r between the glass-ceramic mixed layers is not smaller than a predetermined value is added to the evaluation of the multiple-layer substrate. When a multiple-layer substrate satisfies conditions that the warpage of substrate of 50 mm square is not larger than 200 μm and that the dielectric constant of one glass-ceramic mixed layer is not less than 10, the multiple-layer substrate is given such comprehensive evaluation as a multiple-layer substrate that is denoted by a symbol of circle (O), and when a multiple-layer substrate does not satisfy the conditions, the multiple-layer substrate is given such comprehensive evaluation as a multiple-layer substrate that is denoted by a symbol of cross (x). The results are shown in Table 6.

TABLE 6

|  | α ($10^{-6}/°$ C.) | ∈ r | Warpage (μm) Substrate of 10 mm square | Warpage (μm) Substrate of 50 mm square | Evaluation of Warpage | Comprehensive evaluation as multilayer substrate |
|---|---|---|---|---|---|---|
| Other glass-ceramic mixed layer | 6.15 | 7.3 |  |  |  |  |
| One glass-ceramic mixed layer |  |  |  |  |  |  |
| Comparative Example 17 | Dense sintered body was not be obtained | — | — | — | X | X |
| Example 28 | 6.36 | 10.4 | 45 | 95 | O | O |
| Example 29 | 6.38 | 10.3 | 50 | 105 | O | O |
| Example 30 | 6.39 | 10.3 | 53 | 109 | O | O |
| Example 31 | 6.40 | 10.3 | 52 | 114 | O | O |
| Comparative Example 18 | 6.41 | 10.3 | 56 | 240 | X | X |
| Example 32 | 6.29 | 10.1 | 42 | 64 | O | O |
| Example 33 | 6.26 | 10.0 | 38 | 50 | O | O |
| Comparative Example 19 | 6.23 | 9.8 | 33 | 36 | O | X |
| Example 34 | 6.39 | 10.4 | 51 | 109 | O | O |
| Comparative Example 20 | 6.42 | 10.6 | 60 | 250 | X | X |

From the results shown in Table 6, it is clear that as the difference in a coefficient of linear thermal expansion between the other glass-ceramic mixed layer and one glass-ceramic mixed layer is smaller, the warpage of the substrate is small. When the other glass-ceramic mixed layer has a coefficient of linear thermal expansion of $6.15\times10^{-6}/°$ C. in a range of 50 to 300° C. whereas one glass-ceramic mixed layer has a coefficient of linear thermal expansion of $5.90\times10^{-6}$ to $6.40\times10^{-6}/°$ C. in a range of 50 to 300° C., the warpage of the substrate is small. That is, when a difference in a coefficient of linear thermal expansion is made not larger than $0.25\times10^{-6}/°$ C., the warpage of the substrate of 50 mm square can be made not larger than 200 μm. More preferably, when a difference in a coefficient of linear thermal expansion is made not larger than $0.21\times10^{-6}/°$ C., th warpage of the substrate of 50 mm square can be made 100 μm. In the comparative examples 18 and 20, a difference in a coefficient of linear thermal expansion is large and the warpage of the substrate was large. In the comparative example 17, a dense sintered body could not be obtained. In the comparative example 19, the dielectric constant was as low as 9.8. As shown in the examples, the multiple-layer substrates having the glass-ceramic mixed layers having different dielectric constants and having a small warpage could be manufactured. With this, it is possible to reduce the thickness and size of a module by inserting a high-capacity capacitance into a multiple-layer substrate with high accuracy held and to improve the degree of flexibility in the designing of a substrate.

INDUSTRIAL APPLICABILITY

The multilayer wiring board using the low-temperature co-fired ceramic material accordance with the present invention can be used an LTCC module such as high-frequency multiplex module, antenna switch module, and filter module.

What is claimed is:

1. A low-temperature co-fired ceramic material selected from the group consisting of:
   A) 60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO;
   more than 0 to not more than 16 volume % alumina:
   10 to 26 volume % titania; and
   2 to 15 volume % cordierite; and
   B) 60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO;
   14 to 27 volume % titania; and
   5 to 15.5 volume % cordierite.

2. The low-temperature co-fired ceramic material as claimed in claim 1 wherein said material comprises:
   60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO;
   more than 0 to not more than 16 volume % alumina;
   10 to 26 volume % titania; and
   2 to 15 volume % cordierite.

3. The low-temperature co-fired ceramic material as claimed in claim 1 wherein said material comprises:
   60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO;
   14 to 27 volume % titania; and
   5 to 15.5 volume % cordierite.

4. The low-temperature co-fired ceramic material as claimed in claim 1 wherein a coefficient of linear thermal expansion in a range of 50 to 300° C. is $5.90 \times 10^{-6}$ to $6.40 \times 10^{-6}$/° C.

5. The low-temperature co-fired ceramic material as claimed in claim 1 wherein a dielectric constant at a frequency of 1.9 GHz at room temperature is not smaller than 10.

6. The low-temperature co-fired ceramic material as claimed in claim 4 wherein a dielectric constant at a frequency of 1.9 GHz at room temperature is not smaller than 10.

7. In a multilayer wiring board of the type in which glass-ceramic mixed layers are laminated, the improvement in which at least one layer of the glass-ceramic mixed layers is made of a low-temperature co-fired ceramic material selected from the group consisting of:
   A) 60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO;
   more than 0 to not more than 16 volume % alumina;
   10 to 26 volume % titania; and
   2 to 15 volume % cordierite; and
   B) 60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO;
   14 to 27 volume % titania; and
   5 to 15.5 volume % cordierite.

8. In a multilayer wiring board as claimed in claim 7 wherein said low-temperature co-fired ceramic material comprises:
   60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO;
   more than 0 to not more than 16 volume % alumina:
   10 to 26 volume % titania; and
   2 to 15 volume % cordierite.

9. In a multilayer wiring board as claimed in claim 7 wherein said low-temperature co-fired ceramic material comprises:
   60 to 78 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO;
   14 to 27 volume % titania; and
   5 to 15.5 volume % cordierite.

10. The multilayer wiring board as claimed in claim 7, wherein the low-temperature co-fired ceramic material has a coefficient of linear thermal expansion of $5.90 \times 10^{-6}$ to $6.40 \times 10^{-6}$/° C. in a range of 50 to 300° C. and a dielectric constant not smaller than 10 at a frequency of 1.9 GHz at room temperature.

11. The multilayer wiring board as claimed in claim 7, wherein a difference in a coefficient of linear thermal expansion in a range of 50 to 300° C. between the glass-ceramic mixed layer made of the low-temperature co-fired ceramic material and another glass-ceramic mixed layer other than the glass-ceramic mixed layer is not larger than $0.25 \times 10^{-6}$/° C.

12. The multilayer wiring board as claimed in claim 10, wherein a difference in a coefficient of linear thermal expansion in a range of 50 to 300° C. between the glass-ceramic mixed layer made of the low-temperature co-fired ceramic material and another glass-ceramic mixed layer other than the glass-ceramic mixed layer is not larger than $0.25 \times 10^{-6}$/° C.

13. The multilayer wiring board as claimed in claim 7, wherein another glass-ceramic mixed layer other than a glass-ceramic mixed layer made of the low-temperate co-fired ceramic material has a dielectric constant of 5 to 8 at a frequency of 1.9 GHz at room temperature.

14. The multilayer wiring board as claimed in claim 10, wherein another glass-ceramic mixed layer other than a glass-ceramic mixed layer made of the low-temperate co-fired ceramic material has a dielectric constant of 5 to 8 at a frequency of 1.9 GHz at room temperature.

15. The multilayer wiring board as claimed in claim 11, wherein another glass-ceramic mixed layer other than a glass-ceramic mixed layer made of the low-temperate co-fired ceramic material has a dielectric constant of 5 to 8 at a frequency of 1.9 GHz at room temperature.

16. The multilayer wiring board as claimed in claim 12, wherein another glass-ceramic mixed layer other than a glass-ceramic mixed layer made of the low-temperate co-fired ceramic material has a dielectric constant of 5 to 8 at a frequency of 1.9 GHz at room temperature.

17. The multilayer wiring board as claimed in claim 7 wherein another glass-ceramic mixed layer other than a glass-ceramic mixed layer made of the low-temperature co-fired ceramic material is a glass-ceramic mixed layer made of a low-temperature co-fired ceramic material comprising:

58 to 76 volume % glass having a composition of 46 to 60 mass % $SiO_2$, 0.5 to 5 mass % $B_2O_3$, 6 to 17.5 mass % $Al_2O_3$, and 25 to 45 mass % alkaline earth metal oxide, at least 60 mass % of the alkaline earth metal oxide being SrO; and 24 to 42 volume % alumina.

18. The multilayer wiring board as claimed in claim 7, wherein a warpage of the multilayer wiring board is not larger than 200 μm for a size of 50 mm square.

19. The multilayer wiring board as claimed in claim 7, wherein a warpage of the multilayer wiring board is not larger than 200 μm for a size of 100 mm square.

* * * * *